(12) United States Patent
Jaramillo et al.

(10) Patent No.: US 10,366,904 B2
(45) Date of Patent: Jul. 30, 2019

(54) ARTICLES HAVING HOLES WITH MORPHOLOGY ATTRIBUTES AND METHODS FOR FABRICATING THE SAME

(71) Applicant: CORNING INCORPORATED, Corning, NY (US)

(72) Inventors: Andres Covarrubias Jaramillo, Corning, NY (US); Yuhui Jin, Painted Post, NY (US); Frank Andrew Kramer, IV, Corning, NY (US); Ekaterina Aleksandrovna Kuksenkova, Painted Post, NY (US); Daniel Wayne Levesque, Jr., Avoca, NY (US); Garrett Andrew Piech, Corning, NY (US); Aric Bruce Shorey, Pittsford, NY (US); Robert Stephen Wagner, Corning, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 15/696,736

(22) Filed: Sep. 6, 2017

(65) Prior Publication Data

US 2018/0068868 A1     Mar. 8, 2018

Related U.S. Application Data

(60) Provisional application No. 62/384,923, filed on Sep. 8, 2016.

(51) Int. Cl.
*H01L 21/48*     (2006.01)
*C03C 15/00*     (2006.01)
(Continued)

(52) U.S. Cl.
CPC .......... *H01L 21/4807* (2013.01); *C03C 15/00* (2013.01); *C03C 23/0025* (2013.01);
(Continued)

(58) Field of Classification Search
CPC ......... H01L 23/49827; H01L 23/49828; H01L 23/5386; H01L 23/0025; H01L 23/5384; H01L 21/4807; C03C 23/0025
See application file for complete search history.

(56) References Cited

U.S. PATENT DOCUMENTS 9,232,652 B2   1/2016   Fushie et al.
9,278,886 B2   3/2016   Boek et al.
(Continued)

OTHER PUBLICATIONS

International Search Report and Written Opinion PCT/US2017/050503 dated Jan. 3, 2018.

*Primary Examiner* — Hoa B Trinh
(74) *Attorney, Agent, or Firm* — John P. McGroarty

(57) ABSTRACT

Articles including a glass-based substrate with holes, semiconductor packages including an article with holes, and methods of fabricating holes in a substrate are disclosed. In one embodiment, an article includes a glass-based substrate having a first surface, a second surface, and at least one hole extending from the first surface. The at least one hole has an interior wall having a surface roughness $R_a$ that is less than or equal to 1 μm. The at least one hole has a first opening having a first diameter that is present the first surface. A first plane is defined by the first surface of the glass-based substrate based on an average thickness of the glass-based substrate. A ratio of a depression depth to the first diameter of the at least one hole is less than or equal to 0.007.

29 Claims, 15 Drawing Sheets

(51) Int. Cl.
*C03C 23/00* (2006.01)
*H01L 23/498* (2006.01)
*H01L 23/538* (2006.01)

(52) U.S. Cl.
CPC .. *H01L 23/49827* (2013.01); *H01L 23/49838* (2013.01); *H01L 23/49894* (2013.01); *H01L 23/5384* (2013.01); *H01L 23/5386* (2013.01); *H01L 2224/16225* (2013.01)

(56) References Cited

U.S. PATENT DOCUMENTS

| | | |
|---|---|---|
| 9,296,646 B2 | 3/2016 | Burket et al. |
| 9,517,963 B2 | 12/2016 | Marjanovic et al. |
| 9,758,876 B2 * | 9/2017 | Shorey ................. C03B 33/102 |
| 2013/0089701 A1 | 4/2013 | Hooper et al. |
| 2013/0228918 A1 * | 9/2013 | Chen ................. H01L 23/49811 |
| | | 257/737 |
| 2014/0147623 A1 | 5/2014 | Shorey et al. |
| 2015/0166395 A1 | 6/2015 | Marjanovic et al. |
| 2016/0035587 A1 | 2/2016 | Keech et al. |
| 2016/0362331 A1 | 12/2016 | Castle et al. |
| 2018/0062342 A1 | 3/2018 | Comstock, II et al. |

* cited by examiner

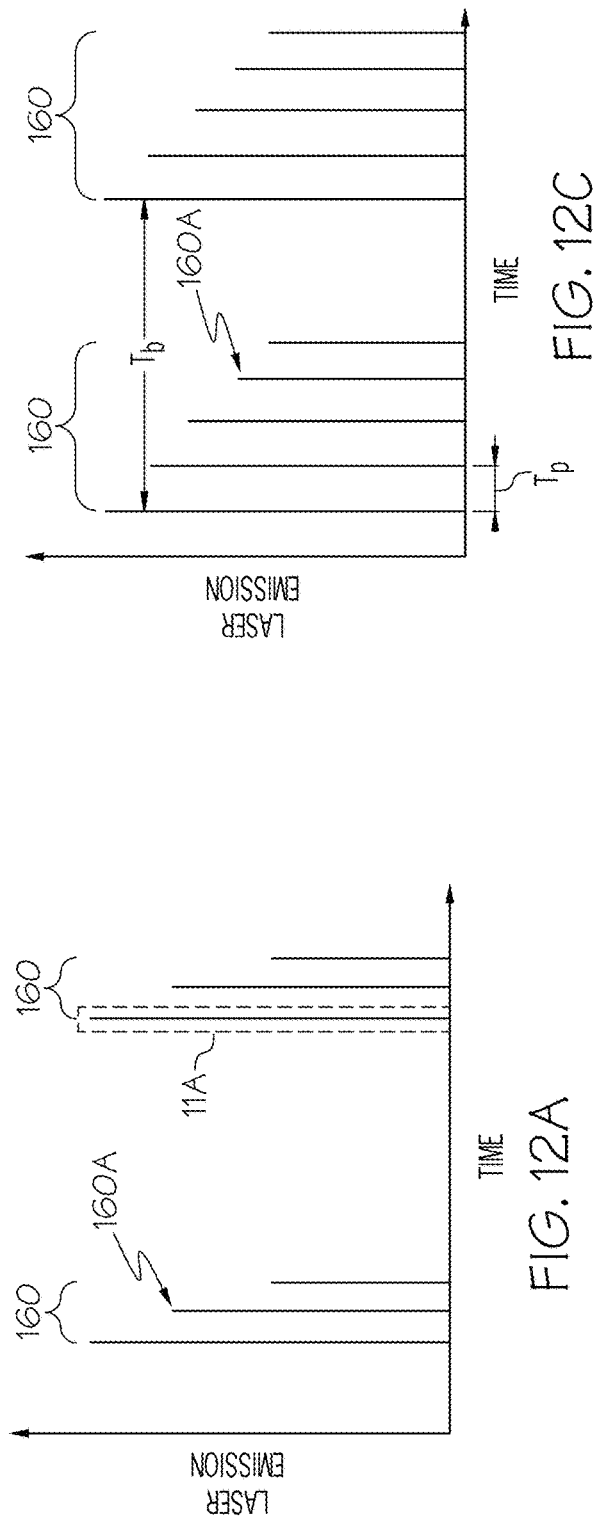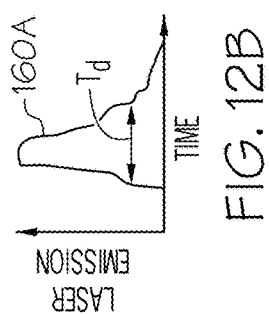

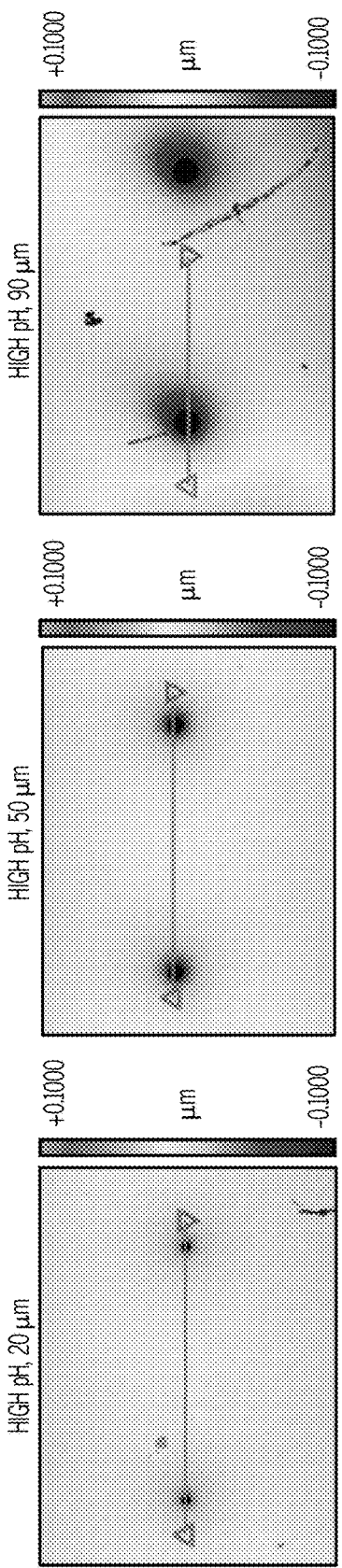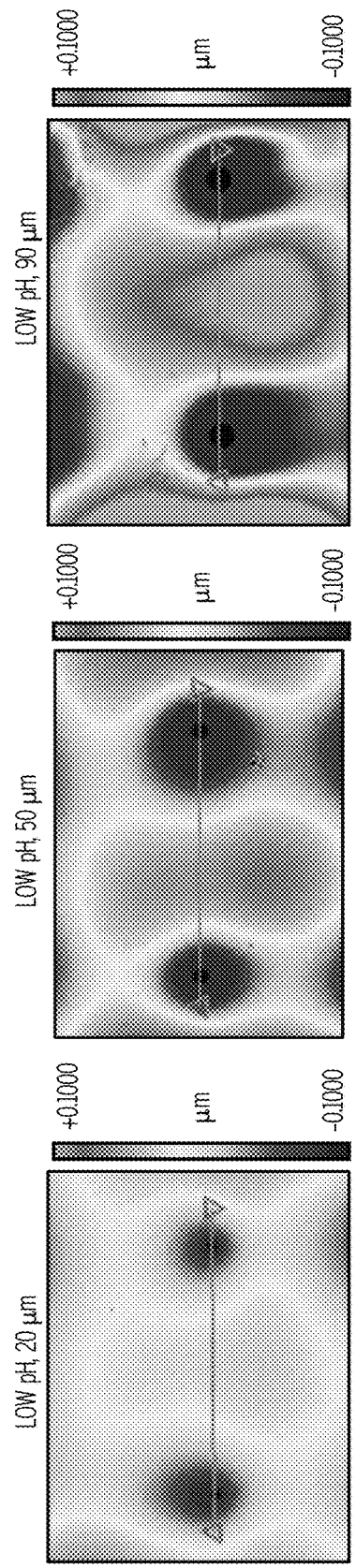
FIG. 18A  FIG. 18B  FIG. 18C
FIG. 18D  FIG. 18E  FIG. 18F

ARTICLES HAVING HOLES WITH MORPHOLOGY ATTRIBUTES AND METHODS FOR FABRICATING THE SAME

CROSS-REFERENCE TO RELATED APPLICATIONS

This application claims the benefit of priority under 35 U.S.C. § 119 of U.S. Provisional Application Ser. No. 62/384,923 filed on Sep. 8, 2016 the content of which is relied upon and incorporated herein by reference in its entirety.

BACKGROUND

Field

The present disclosure generally relates to articles having holes etched therein. In particular, the present disclosure is directed to articles having holes with a desired morphology, as well as to laser and etching processes for fabricating such articles.

Technical Background

Substrates, such as silicon, have been used as an interposer disposed between electrical components (e.g., printed circuit boards, integrated circuits, and the like). Metalized through-substrate vias provide a path through the interposer for electrical signals to pass between opposite sides of the interposer. Glass is a substrate material that is highly advantageous for electrical signal transmission, as it that has good dimensional stability, a tunable coefficient of thermal expansion ("CTE"), very good low electrical loss at high frequencies electrical performance, high thermal stability, and an ability to be formed at thickness and at large panel sizes. However, through-glass via ("TGV") formation and metallization present two main challenges in development of the glass interposer markets.

Hole morphology attributes play a role in the ability for holes within a glass substrate to be properly metalized. Holes having too rough an interior wall may cause the electrically conductive material to not adhere to the surfaces of the wall, and may also create high electrical resistance, particularly at high operating frequencies. Further, laser-drilled and etched holes through a glass substrate may have depressions, mounds and other abnormalities surrounding the openings to the holes. These abnormalities create issues with downstream processes, such as deposition of redistribution layers on the surfaces of substrate.

Accordingly, a need exists for alternative articles having holes with improved morphology attributes, as well as processes for achieving such improved morphology attributes.

SUMMARY

In a first aspect, an article includes a glass-based substrate having a first surface, a second surface, and at least one hole extending from the first surface. The at least one hole has an interior wall having a surface roughness $R_a$ that is less than or equal to 1 µm. The at least one hole has a first opening having a first diameter that is present at the first surface. A first plane is defined by the first surface of the glass-based substrate based on an average thickness of the glass-based substrate. A ratio of a depression depth to the first diameter of the at least one hole is less than or equal to 0.007. The depression depth is measured from the first plane to the first surface at the first opening of the at least one hole.

A second aspect according to the first aspect, wherein the at least one hole is a through hole extending from the first surface to the second surface such that a second opening having a second diameter is present on the second surface, a second plane is defined by the second surface of the glass-based substrate based on the average thickness of the glass-based substrate, and a ratio of a second depression depth to the second diameter of the at least one hole is less than or equal to 0.007. The second depression depth is measured from the second plane to the second surface at the second opening of the at least one hole.

A third aspect according to the second aspect, wherein a difference between the first diameter and the second diameter is less than or equal to 2 µm.

A fourth aspect according to the second aspect, wherein the at least one hole includes a waist having a waist diameter, and the waist diameter is greater than or equal to 80% of a largest of the first diameter and the second diameter.

A fifth aspect according to the second aspect, wherein the at least one hole includes a waist having a waist diameter, and the waist diameter is within a range of 20% to 100% of a largest of the first diameter and the second diameter.

A sixth aspect according to any preceding aspect, wherein the ratio of the depression depth to the first diameter is less than or equal to 0.005.

A seventh aspect according to any preceding aspect, wherein the ratio of the depression depth to the first diameter is less than or equal to 0.003.

An eighth aspect according to any preceding aspect, wherein the surface roughness $R_a$ of the interior wall is in a range from 0.1 µm to 1 µm.

A ninth aspect according to any preceding aspect, wherein the first diameter of the at least one hole is in a range from 5 µm to 250 µm.

A tenth aspect according to any one of the first through seventh aspects, wherein the first diameter of the at least one hole is in a range from 5 µm to 100 µm.

An eleventh aspect according to any preceding aspect, wherein the glass-based substrate is transparent to at least one wavelength in the range from 390 nm to 1100 nm.

A twelfth aspect according to any preceding aspect, wherein, the at least one hole is a plurality of holes.

A thirteenth aspect according to one of the first and sixth through twelfth aspects, wherein the at least one hole is a blind hole.

A fourteenth aspect according to any preceding aspect, wherein a circularity of the at least one hole is less than or equal to 5 µm.

A fifteenth aspect according to any preceding aspect, wherein an aspect ratio of the average thickness of the glass-based substrate to the first diameter of the at least one hole is in a range from 1:1 to 15:1.

A sixteenth aspect according to the first aspect, wherein the at least one hole is a through-hole such that a second opening having a first diameter having a second diameter is present on the second surface, a difference between the first diameter and the second diameter is less than or equal to 2 µm, a circularity of the at least one hole is less than or equal to 5 µm, each of the first diameter and the second diameter is in a range from 5 µm to 250 µm, and an aspect ratio of the average thickness of the glass-based substrate to at least one of the first diameter and the second diameter is in a range from 1:1 to 15:1.

A seventeenth aspect according to the sixteenth aspect, wherein the at least one hole includes a waist having a waist diameter, and the waist diameter of the at least one hole is greater than or equal to 80% of a largest of the first diameter and the second diameter.

An eighteenth aspect in accordance with the sixteenth aspect, wherein the at least one hole includes a waist having a waist diameter, and the waist diameter is within a range from 20% to 100% of a largest of the first diameter and the second diameter.

In a nineteenth aspect, a semiconductor package includes a glass-based substrate including a first surface, a second surface, and at least one hole extending from the first surface. The at least one hole includes an interior wall having a surface roughness $R_a$ that is less than or equal to 1 μm. The at least one hole includes a first opening having a first diameter that is present on at the first surface and a second opening having a second opening that is on the second surface. A first plane is defined by the first surface of the glass-based substrate based on an average thickness of the glass-based substrate. A ratio of a depression depth to the first diameter of the at least one hole is less than or equal to 0.007. The depression depth is measured from the first plane to the first surface at the first opening of the at least one hole. An electrically conductive material is disposed within the at least one hole. The semiconductor package further includes a semiconductor device electrically coupled to the electrically conductive material disposed within the at least one hole.

A twentieth aspect according to the nineteenth aspect, wherein a ratio of a second depression depth to the second diameter of the at least one hole is less than or equal to 0.007, wherein the second depression depth is measured from the second plane to the second surface at the second opening of the at least one hole, the second plane being defined by the first surface of the glass-based substrate based on the average thickness of the glass-based substrate.

A twenty-first aspect according to the twentieth aspect, wherein a difference between the first diameter and the second diameter is less than or equal to 2 μm.

A twenty-second aspect according to the twenty-first aspect, wherein the at least one hole includes a waist having a waist diameter, and the waist diameter is greater than or equal to 80% of a largest of the first diameter and the second diameter.

A twenty-third aspect according to the twenty-first aspect, wherein the at least one hole includes a waist having a waist diameter, and the waist diameter is within a range from 20% to 100% of a largest of the first diameter and the second diameter.

A twenty-fourth aspect according to any one of the nineteenth through twenty-third aspects, the semiconductor package further including an electrically conductive layer disposed on the first surface of the glass-based substrate, wherein the electrically conductive layer is electrically coupled to the electrically conductive material disposed within the at least one hole.

A twenty-fifth aspect according to any one of the nineteenth through twenty-fourth aspects, wherein the ratio of the depression depth to the first diameter of the at least one hole is less than or equal to 0.005.

A twenty-sixth aspect according to any one of the nineteenth through twenty-fifth aspects, wherein the ratio of the depression depth to the first diameter of the at least one hole is less than or equal to 0.003.

A twenty-seventh aspect according to any one of the nineteenth through twenty-sixth aspects, wherein the surface roughness $R_a$ of the interior wall of the at least one hole is in a range from 0.1 μm to 1 μm.

A twenty-eighth aspect according to any one of the nineteenth through twenty-seventh aspects, wherein the first diameter is in a range from 5 μm to 250 μm.

A twenty-ninth aspect according to any one of the nineteenth through twenty-eighth aspects, wherein the at least one hole is a plurality of holes.

A thirtieth aspect according to any one of the nineteenth through twenty-ninth aspects, wherein a circularity of the at least one hole is less than or equal to 5 μm.

A thirty-first aspect according to any one of the nineteenth through thirtieth aspects, wherein an aspect ratio of the average thickness of the glass-based substrate to the first diameter is in a range from 1:1 to 15:1.

A thirty-second aspect according to the nineteenth aspect, wherein a difference between the first diameter and the second diameter is less than or equal to 2 μm, a circularity of the at least one hole is less than or equal to 5 μm, each of the first diameter and the second diameter is in a range from 5 μm to 250 μm, and an aspect ratio of the average thickness of the glass-based substrate to at least one of the first diameter and the second diameter is in a range from 1:1 to 15:1.

A thirty-third aspect according to the thirty-second aspect, wherein the at least one hole includes a waist having a waist diameter, and the waist diameter of the at least one hole is greater than or equal to 80% of a largest of the first diameter and the second diameter.

A thirty-fourth aspect according to the thirty-second aspect, wherein the at least one hole includes a waist having a waist diameter, and the waist diameter is within a range from 20% to 100% of a largest of the first diameter and the second diameter.

A thirty-fifth aspect according to the thirty-second aspect, wherein the semiconductor package is a radio frequency antenna chip.

In a thirty-sixth aspect, an article includes a glass-based substrate including a first surface, a second surface, and at least one hole extending from at least one of the first surface and the second surface, wherein the at least one hole includes an interior wall having a surface roughness $R_a$ that is less than or equal to 1 μm, the at least one hole including a first opening having a first diameter at the first surface, and the first diameter is in a range from 5 μm to 250 μm.

A thirty-seventh aspect according to the thirty-sixth aspect, wherein the surface roughness $R_a$ of the interior wall is less than or equal to 0.3 μm.

A thirty-eighth aspect according to the thirty-sixth aspect or the thirty-seventh aspect, wherein the surface roughness $R_a$ of the interior wall is less than or equal to 0.2 μm.

A thirty-ninth aspect according to one of the thirty-sixth through the thirty-eighth aspects, wherein the first diameter of the at least one hole is in a range from 5 μm to 100 μm.

In a fortieth aspect, a method of forming a hole in a substrate includes applying a pulsed laser beam to the substrate to form at least one laser damage region within the substrate, and etching the substrate in a liquid etching solution to enlarge the at least one laser damage region to form at least one hole within the substrate, such that the at least one hole includes an interior wall having a surface roughness $R_a$ that is less than or equal to 1 μm; the at least one hole includes a first opening having a first diameter that is present on the first surface of the substrate, and a ratio of a depression depth to the first diameter of the at least one hole is less than or equal to 0.007, wherein the depression depth is measured from a first plane to the first surface at the first opening of the at least one hole, and the first plane is defined by the first surface of the substrate based on an average thickness of the substrate.

A forty-first aspect according to the fortieth aspect, wherein an etch rate of the etching solution is within a range from 1 µm/min to 10 µm/min.

A forty-second aspect according to the forty-first aspect, wherein an etch rate of the etching solution is within a range from 3 µm/min to 4 µm/min.

A forty-third aspect according to any one of the fortieth through forty-second aspects, wherein the etching solution has a pH in a range from 1.0 to 2.0.

A forty-fourth aspect according to any of the fortieth through forty-second aspects, wherein the etching solution has a pH in a range from 1.0 to 2.0, and the etching solution provides an etch rate that is less than about 4 µm/min.

A forty-fifth aspect according to any of the fortieth through forty-fourth aspects, wherein etching the substrate further includes applying ultrasonic agitation to the etching solution, the ultrasonic agitation having a frequency within a range from 40 kHz to 192 kHz.

A forty-sixth aspect according to the fortieth aspect, wherein the etching solution includes 1.5M HF and 1.6M $HNO_3$.

A forty-seventh aspect according to the fortieth aspect, wherein the etching solution includes 1.5M HF and 1.6M $HNO_3$, the temperature of the etching solution is within a range of 10° C. to 30° C., and ultrasonic agitation is applied to the etching solution, the ultrasonic agitation having a frequency within a range from 40 kHz to 192 kHz.

A forty-eighth aspect according to any of the fortieth through forty-seventh aspects, wherein applying the pulsed laser beam to the substrate further includes affixing a sacrificial cover layer to a surface of the substrate, positioning the laser beam in a predetermined location relative to the substrate and corresponding to a desired location of the at least one hole, forming the at least one laser damage region in the sacrificial cover layer by repeatedly pulsing the laser beam at the predetermined location, and pulsing the laser beam into the through-hole formed in the sacrificial cover layer at the predetermined location thereby creating the at least one damage region in the substrate.

A forty-ninth aspect according to the forty-eighth aspect, wherein the laser beam has a numerical aperture between about 0.02 and about 0.4, and a focus position of the laser beam is within about 100 µm of a surface of the sacrificial cover layer.

A fiftieth aspect according to the forty-eighth aspect or the forty-ninth aspect, wherein the laser beam has a wavelength of about 355 nm, the laser beam is has a pulse width between about 5 ns and about 75 ns, the laser beam is pulsed at a repetition rate between about 1 kHz and about 30 kHz, and the laser beam has a pulse energy between about 25 µJ and about 175 µJ.

A fifty-first aspect according to any one of the fortieth through forty-seventh aspects, wherein applying the pulsed laser beam to the substrate further includes forming a damage track defining the at least one laser damage region into the substrate by focusing a pulsed laser beam into a laser beam focal line oriented along a beam propagation direction and directing the laser beam focal line into the substrate.

A fifty-second aspect according to the fifty-first aspect, wherein the laser beam focal line extends through an entire bulk of the substrate.

A fifty-third aspect according to the fifty-first aspect or the fifty-second aspect, wherein a wavelength of the pulsed laser beam is about 532 nm.

A fifty-fourth aspect according to any one of the fifty-first through fifty-third aspects, wherein the pulsed laser beam includes a sequence of bursts, each laser beam including a sequence of pulses.

A fifty-fifty aspect according to the fifty-fourth aspect, wherein a number of pulses per burst is within a range of 10 to 20, and an average energy per burst is within a range of 100 µJ to 200 µJ.

A fifty-sixth aspect according to any one of the fortieth through fifty-fifth aspects, wherein the surface roughness $R_a$ of the interior wall is in a range from 0.1 µm to 1 µm.

A fifty-seventh aspect according to any one of the fortieth through fifty-sixth aspects, wherein the first diameter of the at least one hole is in a range from 5 µm to 250 µm.

A fifty-eighth aspect according to the fifty-seventh aspect, wherein the first diameter is in a range from 5 µm to 100 µm.

A fifty-ninth aspect according to any one of the fortieth through fifty-eighth aspects, wherein the substrate is transparent to at least one wavelength in the range from 390 nm to 1100 nm.

A sixtieth aspect according to any one of the fortieth through fifty-ninth aspects, wherein the substrate is a glass-based substrate.

A sixty-first aspect according to any one of the fortieth through sixtieth aspects, wherein the at least one hole is a plurality of holes.

A sixty-second aspect according to any one of the fortieth through sixty-first aspects, wherein the at least one hole is a blind hole.

A sixty-third aspect according to any one of the fortieth through sixty-first aspects, wherein the at least one hole is a through-hole such that a first opening having a second diameter is present on the first surface and a second opening is present on the second surface, a second plane is defined by the second surface of the substrate based on the average thickness of the substrate, and a ratio of a second depression depth to the second diameter of the at least one hole is less than or equal to 0.007, wherein the second depression depth is measured from the second plane to the second surface at the second opening of the at least one hole.

A sixty-fourth aspect according to the sixty-third aspect, wherein the first opening has a first diameter, the second opening has a second diameter, and a difference between the first diameter and the second diameter is less than or equal to 2 µm.

A sixty-fifth aspect according to the sixty-fourth aspect, wherein the at least one hole includes a waist having a waist diameter, and the waist diameter is greater than or equal to 80% of a largest of the first diameter of the first opening and the second diameter of the second opening.

A sixty-sixth aspect according to the sixty-fourth aspect, wherein the at least one hole includes a waist having a waist diameter, and the waist diameter is within a range from 20% to 100% of a largest of the first diameter and the second diameter.

A sixty-seventh aspect according to any one of the fortieth through sixty-sixth aspects, wherein a circularity of the at least one hole is less than or equal to 5 µm.

A sixty-eighth aspect according to any one of the fortieth through sixty-sixth aspects, wherein an aspect ratio of the average thickness of the substrate to the first diameter of the at least one hole is in a range from 1:1 to 15:1.

A sixty-ninth aspect according to the fortieth aspect, wherein the substrate is a glass-based substrate, the at least one hole is a through-hole such that a second opening having a second diameter is present on the second surface, the first opening has a first diameter and the second opening has a second diameter, a difference between the first diameter and the second diameter is less than or equal to 2 µm, a circularity of the at least one hole is less than or equal to 5 µm, each of the first diameter and the second diameter is in a range from 5 µm to 250 µm, and an aspect ratio of the average thickness of the substrate to at least one of the first diameter and the second diameter is in a range from 1:1 to 15:1.

A seventieth aspect according to the sixty-ninth aspect, wherein the at least one hole include a waist having a waist diameter, and the waist diameter of the at least one hole is greater than or equal to 80% of a largest of the first diameter of the first opening and the second diameter of the second opening.

A seventy-first aspect according to the sixty-ninth aspect, wherein the at least one hole includes, a waist having a waist diameter, and the waist diameter is within a range from 20% to 100% of a largest of the first diameter of the first opening and the second diameter of the second opening.

A seventy-second aspect including an article made according to any one of the fortieth through seventy-first aspects.

Additional features and advantages of the will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

BRIEF DESCRIPTION OF THE DRAWINGS

The embodiments set forth in the drawings are illustrative and exemplary in nature and are not intended to limit the subject matter defined by the claims. The following detailed description of the illustrative embodiments can be understood when read in conjunction with the following drawings, where like structure is indicated with like reference numerals and in which:

FIG. 12A-12C are a graphs of example laser emission as a function of time for a picosecond laser according to one or more embodiments described and illustrated herein;

FIGS. 18A-18F are images of holes that illustrate an effect of the pH of an etching solution on depression depth surrounding openings of the holes;

DETAILED DESCRIPTION

Referring generally to the figures, embodiments of the present disclosure are generally related to articles that may be used as an interposer in a semiconductor package, the articles having holes (e.g., vias) and surface attributes which allow for successful downstream processing including, but not limited to, via metallization and application of redistribution layers (RDL) for semiconductor devices, radio-frequency (RF) devices (e.g., antennae, switches, and the like), interposer devices, microelectronic devices, optoelectronic devices, microelectronic mechanical system (MEMS) devices and other applications where vias may be leveraged.

More particularly, embodiments described herein are directed to articles having holes formed by a laser damage and etch process with desired morphology attributes including, among others, interior walls having low surface roughness ($R_a$ less than 1 μm) and a depression depth $D_{dep}$ surrounding the openings of the holes such that a ratio of the depression depth $D_{dep}$ to the opening diameter of the hole at the surface is less than 0.007. Ultimately, the holes may be coated or filled with an electrically conductive material. Holes having low interior wall surface roughness allow for increased adhesion between the electrically conductive material and the interior wall as well as lower electrical resistance. The small depression depth $D_{dep}$ around the openings of the holes increases the reliability of downstream processes.

Embodiments of the present disclosure are further directed to laser-drilling and etching processes that result in articles having holes with the desired morphology. Articles, such as glass articles, having the desired hole morphology described herein may be implemented as an interposer in a semiconductor device, such as an RF antenna, for example.

Various embodiments of articles, semiconductor packages and methods of forming a hole in a substrate are described in detail below.

Figure 1:
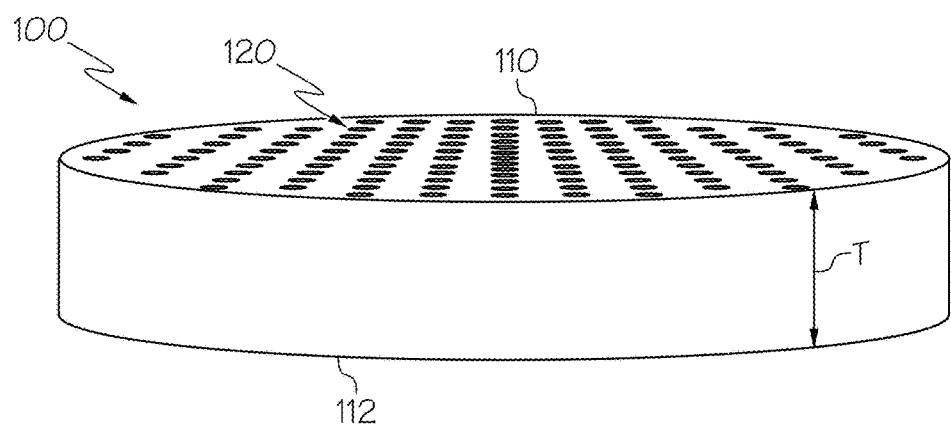
FIG. 1 schematically depicts an example article configured as a wafer having holes therein according to one or more embodiments described and illustrated herein.
Figure 2A:
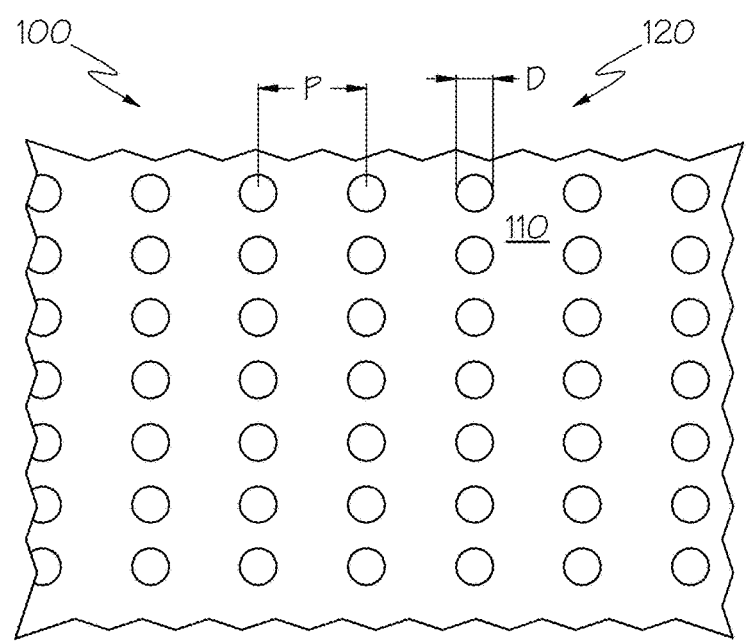
FIG. 2A schematically depicts a top view of an example article having holes therein according to one or more embodiments described and illustrated herein.

FIG. 1 schematically illustrates a perspective view of an example article 100 having a plurality of holes 120 disposed therein. FIG. 2 schematically depicts a top-down view of the example article 100 depicted in FIG. 1. Although FIGS. 1 and 2 depict an article 100 configured as a wafer, it should be understood that the article may take on any shape, such as, without limitation, a panel. The articles described herein are fabricated from a light-transmissive substrate capable of allowing radiation having a wavelength within the visible spectrum to pass therethrough. For example, the substrate may transmit at least 70%, at least 75%, at least 80%, at least 85%, or at least 90% of at least one wavelength in a range from 390 nm to 700 nm. The substrate may be a glass-based substrate. As used herein, glass-based substrate materials means glass (including fused silica), and glass ceramics. In some embodiments, the substrate can be glass and the glass can include fused silica, alkali containing glass, alkali-free glass (for example an alkali-free alkaline aluminoborosilicate glass), or laminated glass pieces with layers containing different glass compositions. In some embodiments, the substrate may have a low coefficient of thermal expansion (e.g., less than or equal to 4 ppm/° C.) and in other embodiments, the substrate may have a high coefficient of thermal expansion (e.g., greater than 4 ppm/° C.).

As noted hereinabove, the article 100 may be implemented as an interposer in an electronic device to pass electrical signals between one or more electronic components coupled to a first surface 110 and one or more electronic components coupled to a second surface 112 of the article 100. The holes 120 of the article 100 are filled with an electrically conductive material to provide electrically conductive vias through which electrical signals may pass. The holes 120 may be through-holes or blind holes, for example. As used herein, a through-hole extends through a thickness of a substrate from a first surface 110 to a second surface 112. As used herein, a blind hole extends only partially through a thickness of a substrate from one of first surface 110 or second surface 112 but not to all the way to the other of first surface 110 or second surface 112. Other features may be formed within the first surface 110 or the second surface 112 of the article 100, such as, without limitation, channels that may be metalized to provide one or more patterns of electrical traces. Other features may also be provided.

Figure 8A:
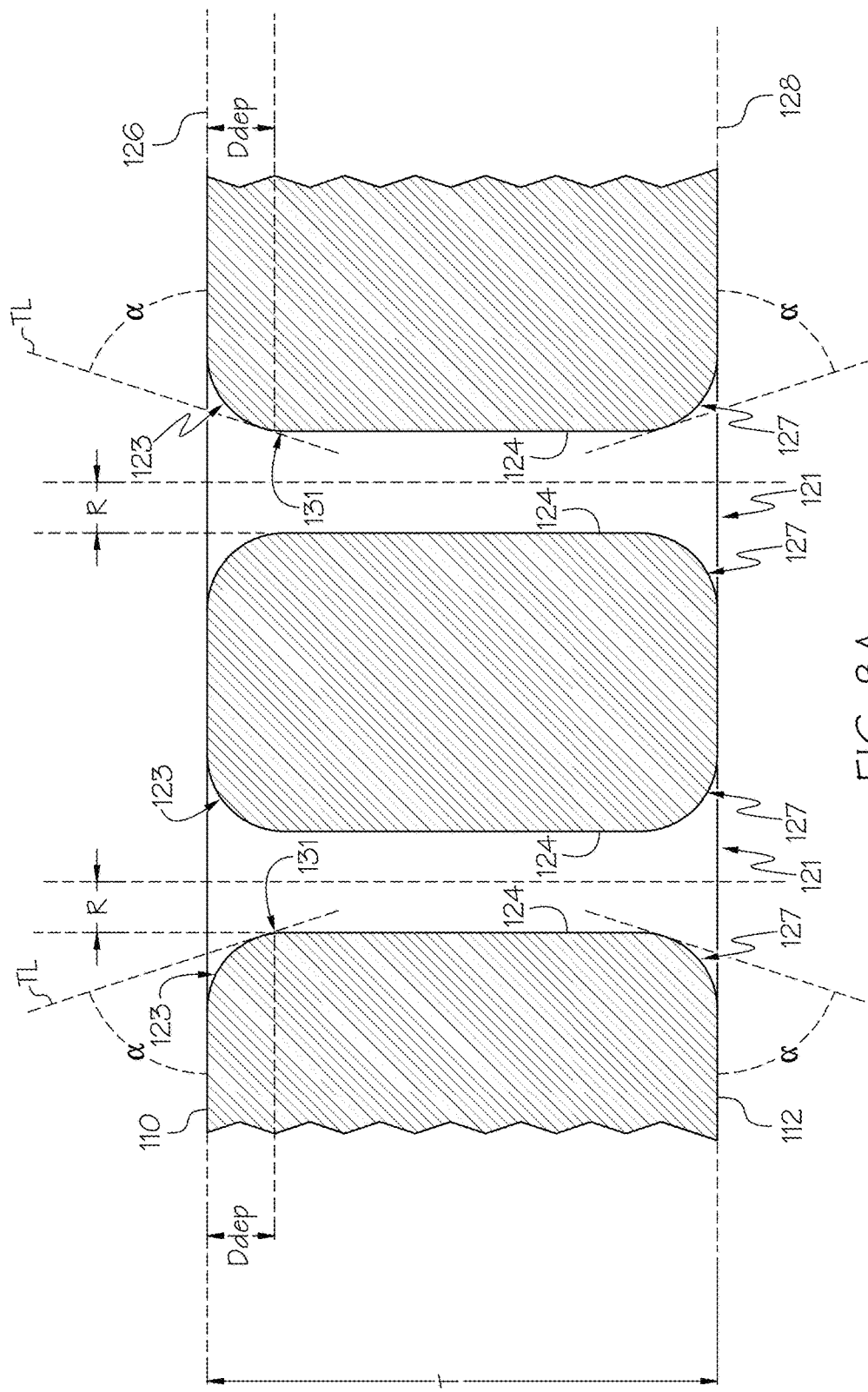
FIG. 8A schematically depicts example holes having depressed regions around openings of the holes according to one or more embodiments described and illustrated herein.

The article 100 may take on any size and shape depending on the end application. As an example and not a limitation, the article 100 may have a thickness T within a range of 25 μm to 3,000 μm. The holes 120 of the article 100 are relatively small in opening diameter D such as, without limitation, less than or equal to 250 μm, less than or equal to 200 μm, less than or equal to 150 μm, less than or equal to 100 μm, less than or equal to 100 μm, less than or equal to 50 μm, less than or equal to 20 μm, or less than or equal to 10 μm. As used herein, the opening diameter D is the diameter of the opening of the hole at the first or second surface of the substrate. Referring briefly to FIG. 8A, the opening of the hole 120 is at the location 131 which marks the transition between a curved slope of a depressed region 123 and the vertical wall 124 of the hole 120. The start of the vertical wall 124, and therefore the opening of the hole 120, is at the location 131 at which an angle α between a tangent line TL of the hole entrance and a first plane 126 defined by an average thickness T of the article 100 is greater than or equal to 75 degrees. The opening diameter D of the hole 120 is calculated by finding a diameter of a least-squares best fit circle to the edges of the entrance to the hole 120 as imaged by an optical microscope. The pitch p of the holes 120, which is the center-to-center spacing between adjacent holes 120, may be any dimension according to the desired application, such as, without limitation, 10 μm, 50 μm, 100 μm, 250 μm, 1000 μm, or any range of varying pitch such as 10 μm to 100 μm, 25 μm to 500 μm, 10 μm to 1000 μm, or 250 μm to 2000 μm.

Figure 8B:
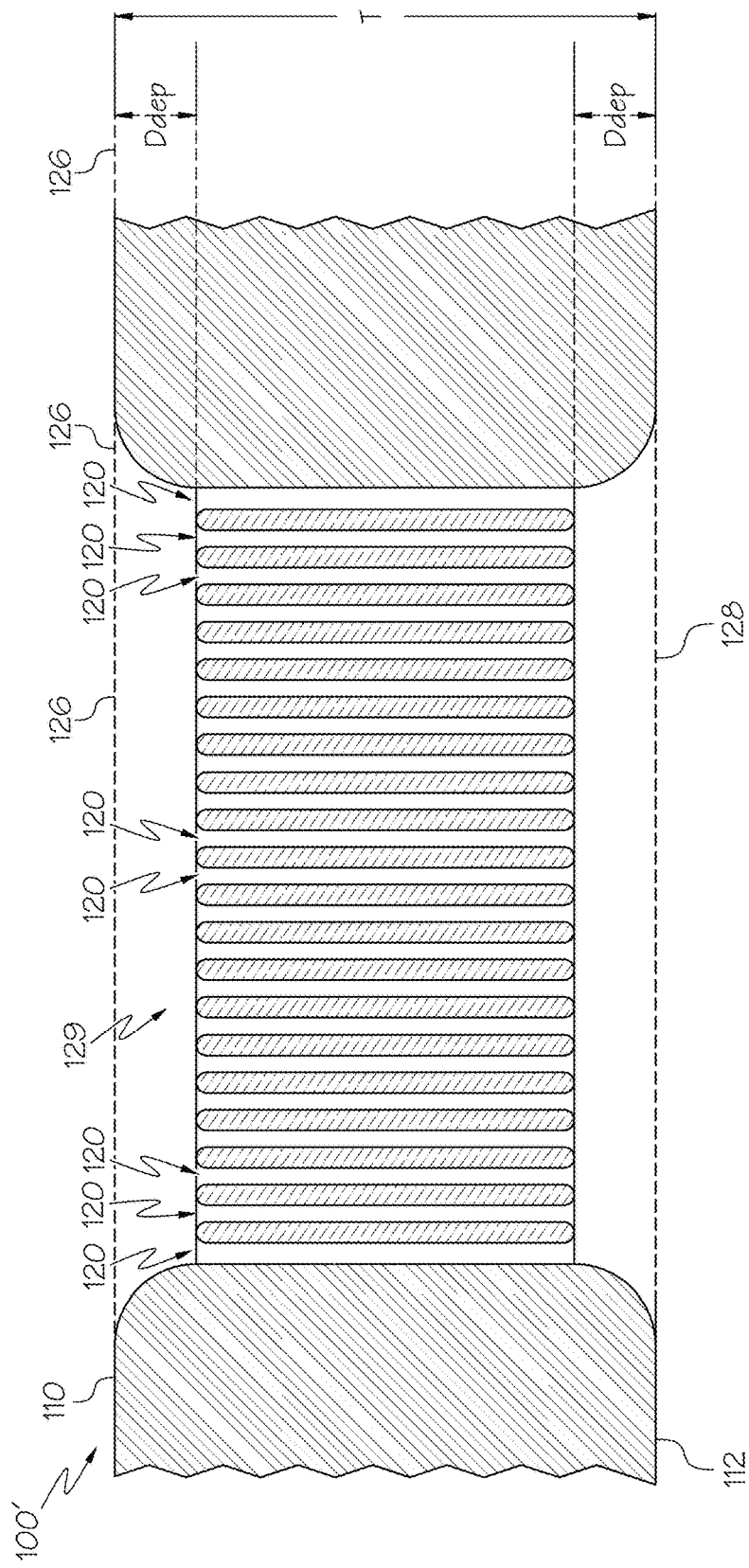
FIG. 8B schematically depicts an example article having an array of holes according to one or more embodiments described and illustrated herein.

As defined herein, the average thickness T of the article 100 is determined by calculating the average of three thickness measurements taken outside of any depressed region 123 on the first surface 110 or the second surface 112 due to the formation of holes 120 (see FIGS. 8A and 8B). As defined herein, the thickness measurements are taken by an interferometer. As described in more detail below, the laser damage and etch process may create depressed regions 123 surrounding the holes formed within the article 100. Thus, the average thickness T is determined by measuring the thickness of the article 100 at three locations outside of the depressed region. As used herein, the phrase "outside of the depressed region" means that the measurement is taken at a distance in a range from 500 μm and 2,000 μm from the nearest hole 120. Further, to obtain an accurate representation of the average thickness of the article, the measurement points should be at least 100 µm away from one another. In other words, no measurement point should be within 100 µm another measurement point.

Figure 2B:
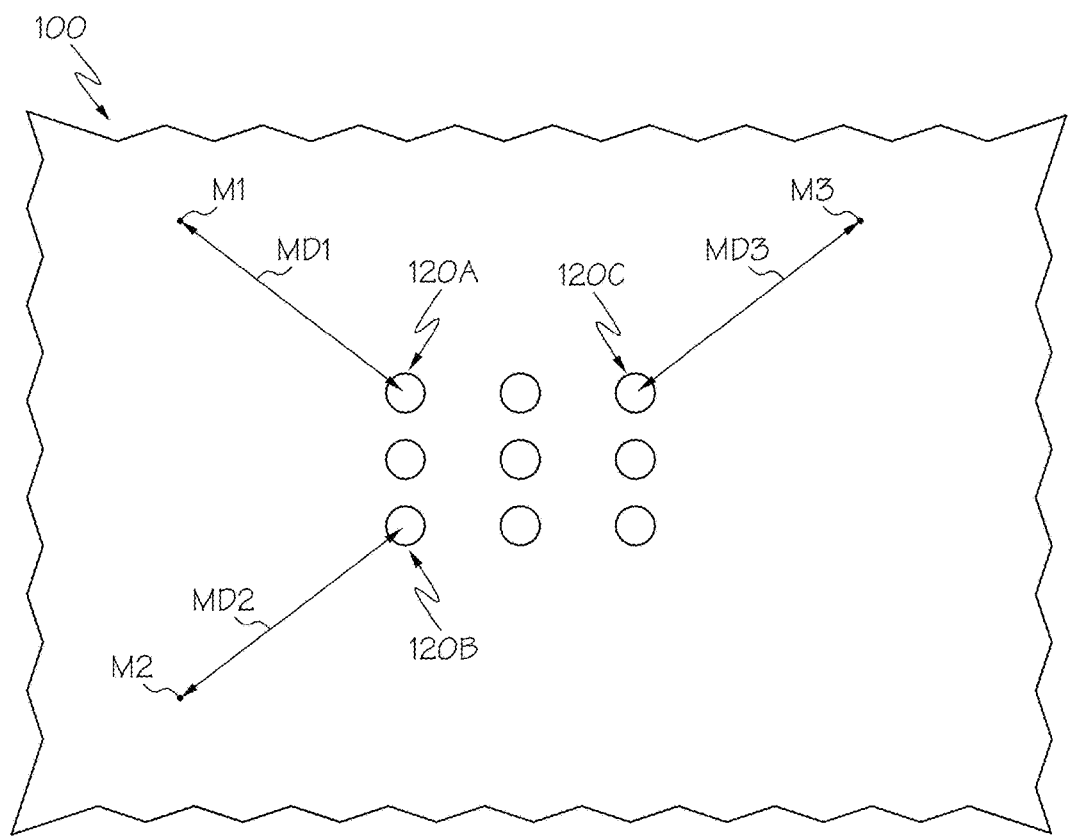
FIG. 2B schematically depicts a top view of an example article having holes therein for determining an average thickness of the article according to one or more embodiments described and illustrated herein.

Referring now FIG. 2B, a non-limiting example of determining an average thickness T of an article 100 is schematically depicted. It should be understood that embodiments are not limited to the configuration of holes 120 and the locations of measurement points M1, M2 and M3 depicted in FIG. 2B, and that FIG. 2B is provided for illustrative purposes only. The example article 100 depicted in FIG. 2B has several holes, three of which are numbered 120A, 120B and 120C. Three thickness measurements are taken by an interferometer at measurement points M1, M2, and M3. As noted above, the thickness measurements should be taken outside of any depressed regions of the article 100, such as depressed regions created by the fabrication of the holes. Regarding measurement point M1, the closest hole is hole 120A. The distance MD1 of measurement point M1 from hole 120A is within a range from 500 µm and 2,000 µm. Similarly, the distance MD2 of measurement point M2 from hole 120B and the distance MD3 of measurement point M3 from hole 120C are within a range from 500 µm and 2000 µm. It is noted that, although FIG. 2B illustrates the closest holes 120A-120C being different for measurement points M1, M2 and M3, embodiments are not limited thereto. As a non-limiting example, a single hole may be used as a reference point in determining the distance from the closest hole (e.g., hole 120A).

After the three thickness measurements are taken at measurement points M1, M2, and M3 by an interferometer, the three thickness measurements are averaged to calculate the average thickness T.

As noted hereinabove, the holes 120 (and other features in some embodiments) may be filled with an electrically conductive material using any known technique including, but not limited to, sputtering, electroless and/or electrolytic plating, chemical vapor deposition, etc. The electrically conductive material may be, for example, copper, silver, aluminum, titanium, gold, platinum, nickel, tungsten, magnesium, or any other suitable material. When holes 120 are filled, they may electrically couple electrical traces of electrical components disposed on the first surface 110 and the second surface 112 of the article 100.

The morphology of the holes 120 plays a role in the quality of the resulting filling of the holes 120. The interior shape (i.e., profile) and roughness of the hole play significant roles in the success of the metallization process. For example, holes that are too rough in texture can lead to poor metallization and inadequate electrical performance after metallization. Furthermore, depending on the metallization process used—paste filling, vacuum sputtering, electroplating, etc.—it can be desirable to tailor the size of the waist (narrowest point) in the hole. In some cases, it is desirable to have as cylindrical a hole (large waist %) as possible (such as >50%, >60%, or >75%, or >80%), in other cases a hole with a specific waist opening (e.g. 20-80%, or 20-60%, or 30-50%, or 40-50%, or 35-45%), may be desired. Metallization processes, such as vacuum deposited coatings, often have line-of-sight issues, meaning that applied coatings cannot reach the innermost areas of rough texture. Or in the case of a one-sided sputtering process, the lower region of an hourglass shaped hole may be difficult to coat because some points in the surface "shadow" others from the coating process. However, for some metallization processes an hourglass shaped hole may be desired because this may allow for easier coating of the surfaces as compared to a cylindrical hole. Any non-optimal shapes or rough texture can also lead to reliability issues post metallization, such as where cracking and other failures can occur when the part is subjected to environmental stress such as thermal cycling. Additionally, along the top and bottom surface of the article, depressions or mounds near the entrance and/or exit of the holes 120 can also lead to plating, coating, and bonding issues when redistribution layer processes are applied. Accordingly, tight control of the morphology of the holes should be present to fabricate a technically viable product. Embodiments of the present disclosure provide for articles having desired morphology attributes, tolerances, and example fabrication processes for achieving articles having such morphology attributes and tolerances.

Figure 3A:
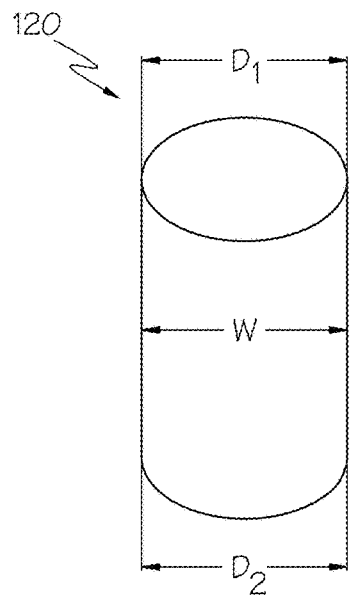
FIG. 3A schematically depicts a cylindrical hole according to one or more embodiments described and illustrated herein.
Figure 3B:
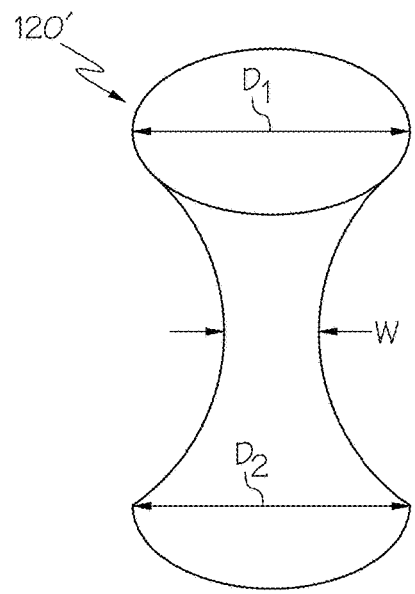
FIG. 3B schematically depicts an hour-glass shaped hole according to one or more embodiments described and illustrated herein.

FIGS. 3A and 3B schematically illustrate two holes 120, 120' within an article 100 in isolation. The hole 120 depicted in FIG. 3A is substantially cylindrical, such that a first diameter $D_1$ (e.g., a diameter of a first opening at the first surface) is substantially equal to a second diameter $D_2$ (e.g., a diameter of a second opening at the second surface) and a diameter along the entire length of the hole 120 is substantially equal to the first diameter $D_1$ and the second diameter $D_2$. The hole 120' depicted in FIG. 3B, however, has an "hourglass" shape such that there is a waist diameter W that is less than both the first diameter $D_1$ and the second diameter $D_2$. As used herein, waist diameter W refers to the narrowest portion of a hole located between the first and second surface. It is noted that the waist need not occur at the midpoint in the depth of the hole, but may occur at any point between the two surfaces. As stated hereinabove, an "hourglass" shaped hole may be undesirable with respect to the metallization process because the electrically conductive material may not be fully deposited within the hole due to the narrow waist.

In some embodiments, the waist diameter W may be greater than or equal to 80% of a largest of the first diameter $D_1$ and the second diameter $D_2$. In other embodiments where an "hourglass" shape may be desired, the waist diameter W is within a range of 20% to 100% of a largest of the first diameter $D_1$ and the second diameter $D_2$. In other embodiments, the waist diameter W may be 85% of a largest of the first diameter $D_1$ and the second diameter $D_2$, 90% of a largest of the first diameter $D_1$ and the second diameter $D_2$, 30% to 100% of a largest of the first diameter $D_1$ and the second diameter $D_2$, 40% to 100% of a largest of the first diameter $D_1$ and the second diameter $D_2$, 50% to 100% of a largest of the first diameter $D_1$ and the second diameter $D_2$, 60% to 100% of a largest of the first diameter $D_1$ and the second diameter $D_2$, 70% to 100% of a largest of the first diameter $D_1$ and the second diameter $D_2$, 80% to 100% of a largest of the first diameter $D_1$ and the second diameter $D_2$, or 90% to 100% of a largest of the first diameter $D_1$ and the second diameter $D_2$.

In some embodiments, the first diameter $D_1$ is substantially equal to the second diameter $D_2$. As an example and not a limitation, the difference between the first diameter $D_1$ and the second diameter $D_2$ is less than or equal to 2 µm, less than or equal to 1.50 µm, less than or equal to 1 µm, less than or equal to 0.75 µm, less than or equal to 0.5 µm, less than or equal to 0.25 µm, less than or equal to 0.1 µm, or less than or equal to 0 µm.

The aspect ratio of the article 100 thickness T to hole diameter $D_1$ or $D_2$ is not limited by this disclosure. In embodiments, this aspect ratio is within a range of 1:1 to 15:1. This aspect ratio may be dictated by the specifications of the end product. Diameters of the holes including $D_1$, $D_2$ and W can be measured by imaging the holes with an optical microscope and calculating a least-squares best fit circle to the edges of the hole 120, for example.

By utilizing the fabrication processes below, hole diameter and waist diameter uniformity is maintained across the article 100. In embodiments, for holes 120 having a desired equal diameter in the article 100, hole diameter uniformity across an article 100 configured as a wafer having a diameter up to 300 mm is ±3%. In embodiments, for holes 120 having a desired equal diameter in the article 100, waist diameter uniformity across an article 100 configured as a wafer having a diameter up to 300 mm is ±5%. As used herein, hole diameter uniformity is determined by the expression $$\frac{D_{max} - D_{min}}{D_{avg}},$$

where $D_{min}$ is the smallest hole diameter on a surface (either the top surface or the bottom surface of the article 100) among holes 120 having a desired equal diameter, $D_{max}$ is the largest hole diameter on the same surface as $D_{min}$ among holes 120 having a desired equal diameter, and $D_{avg}$ is the average diameter among holes 120 having a desired equal diameter on the surface As used herein, waist diameter uniformity is determined by the expression $$\frac{W_{max} - W_{min}}{W_{avg}},$$

where $W_{min}$ is the smallest waist diameter among holes 120 having a desired equal diameter, $W_{max}$ is the largest waist diameter among holes 120 having a desired equal diameter, and $W_{avg}$ is the average waist diameter among holes 120 having a desired equal diameter.

Accurate placement of the holes 120 within the article 100 may also be important in the end product. As one non-limiting example, hole-to-hole placement accuracy on an article 100 configured as a wafer up to 300 mm in diameter may be less than ±5 µm, less than ±4 µm, less than ±3 µm, less than ±2 µm, or less than ±1 µm. As another non-limiting example, hole-to-hole placement accuracy on an article 100 configured as a panel that is up to 600 mm by 600 mm in size may be less than ±10%, less than ±9 µm, less than ±8 µm, less than ±7 µm, less than ±6 µm, less than ±5 µm, less than ±4 µm, less than ±3 µm, less than ±2 µm, or less than ±1 µm. Although various alignment techniques exist, in this disclosure, a "best fit" alignment scheme is utilized herein. To determine hole placement accuracy, once all of the holes of the article are measured, the set of points $\{C_1, C_2, \ldots, C_m\}$ for an article with m holes can be transformed by rotation and translation (but not by scaling) to match a set of points $\{N_1, N_2, \ldots, N_m\}$, which are the nominal locations of holes on the article, such that the quantity $\Sigma_{i=0}^{m} \text{dist}(C_i, N_i)^2$ is minimized.

Another morphology attribute that may affect the metallization process is the circularity of the holes 120. The circularity of the holes 120 may also affect the performance of the article 100 as an interposer. For example, non-circular holes may not fully connect to electrically conductive traces on the surfaces of the article 100. Further, after filling the holes with conductive material, noncircular holes can lead to misalignment with redistribution layers deposited on the surface. Additionally, resistivity of the metalized holes 120 may be adversely affected by non-circular holes, particularly when high frequency signals are propagated through the article 100.

Figure 4:
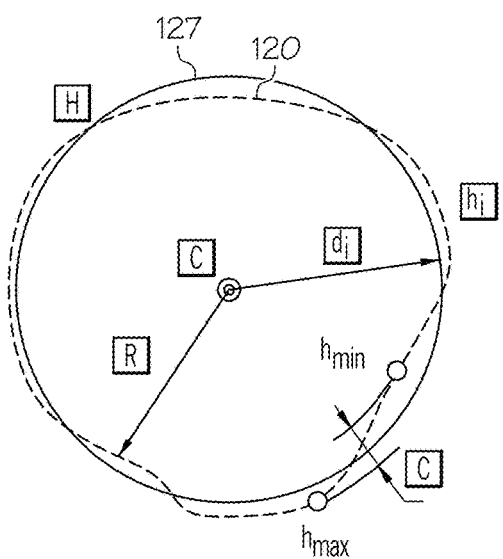
FIG. 4 graphically depicts a calculation of circularity of an hole within an article according to one or more embodiments described and illustrated herein.

FIG. 4 schematically depicts circularity of a sample hole. As used herein, circularity is determined by fitting a circle to a microscope image of the hole 120. Taking H = $\{h_1, h_2, \ldots, h_n\}$ to be a collection of points $h_i=(x_i,y_i)$ identified along the edge of the hole 120 as viewed from above (e.g., from a microscope image of the hole 120). The points may be, without limitation, at a resolution of approximately 1 µm per pixel. Exactly one least squares fit circle can be evaluated. The center point of this circle $C=(x_c,y_c)$ and its radius R minimize the quantity $\Sigma_{i=1}^{n}(\sqrt{(x_c-x_i)^2+(y_c-y_i)^2}-R^2)$.

Given the set of distances (diameters) $d_i=\text{dist}(h_i, C)$, a minimum value $d_{min}$ and a maximum value $d_{max}$ can be found. The difference $d_{max}-d_{min}$ is referred to here as circularity. Thus, a theoretically perfect circle, for which all distances $d_i$ are equal, will have equivalent values of $d_{min}$ and $d_{max}$ leading to a circularity value of zero. Larger values of circularity are indicative of less round holes. Articles described herein have a circularity that is less than or equal to 5 µm, less than or equal to 4 µm, less than or equal to 3 µm, less than or equal to 2 µm, less than or equal to 1 µm, or equal to 0 µm.

As noted hereinabove, surface roughness of the interior walls of the holes 120 negatively affects the metallization process, causes inadequate electrical performance at high frequencies, and reliability issues (e.g., cracking or other failures). The processes described herein below enable articles 100 having holes 120 with smooth interior surfaces that promote adhesion of the electrical conductive material to the interior surfaces. As used herein, a "smooth interior surface" is an interior surface where the surface roughness $R_a$ of the interior surface of the holes is less than or equal to 1 µm, less than or equal to 0.9 µm, less than or equal to 0.8 µm, less than or equal to 0.7 µm, or less than or equal to 0.6 µm, less than or equal to 0.5 µm, less than or equal to 0.4 µm, less than or equal to 0.3 µm, less than or equal to 0.2 µm, less than or equal to 0.1 µm, within a range from 0.1 µm to 1 µm, within a range from 0.1 µm to 0.5 µm, or within a range from 0.1 µm to 0.3 µm.

Figure 5:
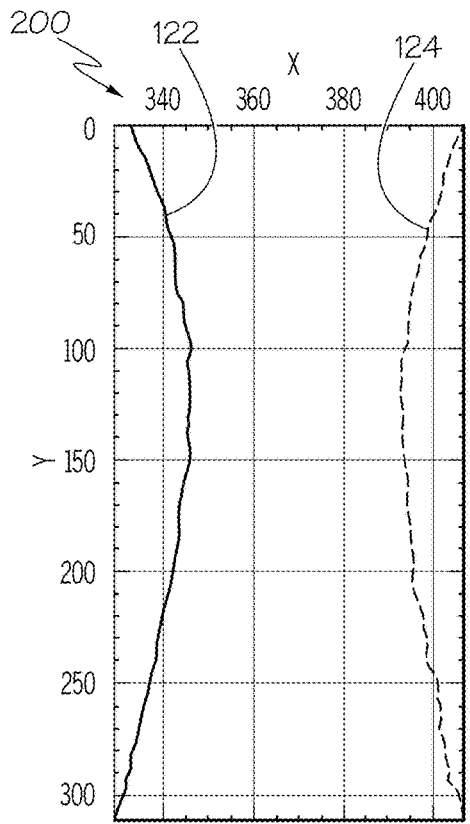
FIG. 5 graphically depicts example detected edges of an image of an hole according to one or more embodiments described and illustrated herein.
Figure 6:
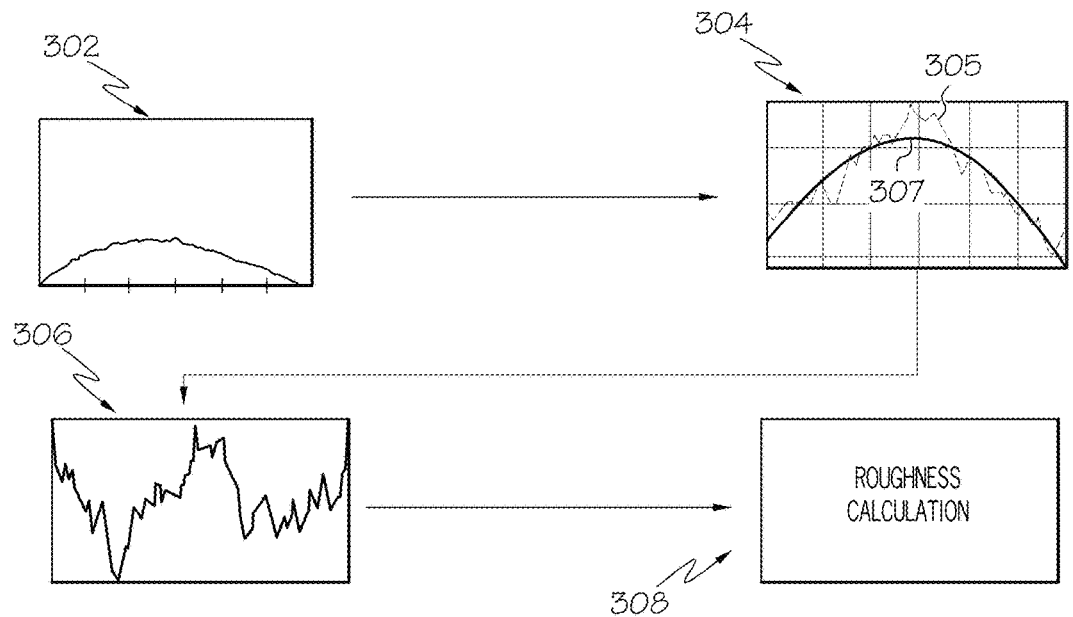
FIG. 6 schematically depicts an example computer-implemented method for calculating roughness of interior walls of an hole according to one or more embodiments described and illustrated herein.
Figure 7:
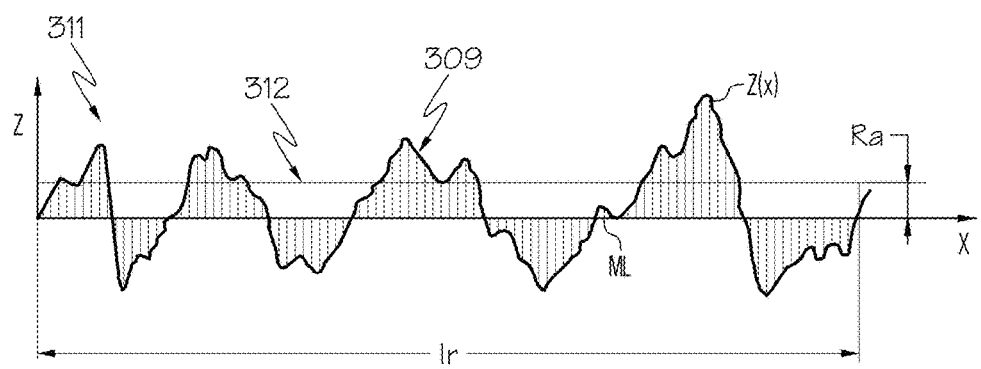
FIG. 7 graphically depicts the roughness $R_a$ of an interior surface of an example hole according to one or more embodiments described and illustrated herein.

FIGS. 5-7 graphically depict a method of determining the surface roughness $R_a$ of the interior surface of the holes 120, which may be curved. Accordingly, embodiments of the present disclosure provide a computer-implemented method for determining a surface roughness $R_a$ of curved surfaces. According to the method, a side profile image of a hole is captured, such as by an optical microscope. An edge detection algorithm is performed on the image of the hole to determine the edges of the hole and the bulk of the substrate. As a non-limiting example, a macro written in ImageJ converts an 8 bit image of the side profile of the hole into a binary figure using the "minimum method" within ImageJ. Subsequently, an edge detection algorithm is used where every row in the image is scanned until a transition from 0 to 255 in the intensity scale is detected (which corresponds to the edge of the hole).

FIG. 5 graphically illustrates a hole profile as detected by edge detection algorithm. Referring to FIG. 6, at block 302, the hole edge location vs. the position within the depth of the substrate is shown (i.e. the edge of the hole now appears to be rotated or horizontal). Although block 302 shows only one half of the hole profile, it should be understood that both sides of the hole may be analyzed and evaluated. At block 304, using a least squares minimization fitting routine, the detected edge 305 is fitted to a polynomial curve 307, typically a second degree polynomial of the kind: $y=ax^2+bx+c$, where y is the distance from the horizontal axis to the detected edge, x is the location on the horizontal axis corresponding to the depth in the substrate, and a, b and c are constants calculated during the fitting routine. Next, at block 306, the intrinsic curvature is removed by subtracting the fitted polynomial curve 307 from the detected edge data 305, and the residuals are calculated to yield a straightened roughness profile 309. At block 308, various statistical roughness parameters may be extracted from the straightened roughness profile 309, such as, without limitation, Ra, Rq, Rz, highest peak, lowest valley, top diameter, bottom diameter, and waist percentage.

The above statistics are calculated using data from the edge of the holes that extends at least 50%, at least 80%, at least 90%, or at least 95% of the full depth of the hole. That is, the roughness data should not represent the roughness of only a small patch of the side of the role (for example a small 50 μm×50 μm area). It instead should capture as much of the interior wall surface through the depth of the hole as possible, so that any bumps, bulges, or other non-ideal features are captured in the analysis of the surface. Any of these features will ultimately affect the ability of electrically conductive material deposited through vacuum deposition or liquid phase plating methods to uniformly and thoroughly coat and fill the hole. Hence, ignoring regions in the analysis of the hole internal roughness is not useful, as any regions with defects will prevent the success of later metallization steps.

The surface roughness $R_a$ is a good indicator of hole quality. FIG. 7 graphically illustrates the determination of the surface roughness $R_a$ in graph 311. Mean line ML is positioned at the average depth of the straightened roughness profile 309, which is defined by Z(x). $R_a$ is defined as the arithmetic mean of the absolute values of the profile deviations Z(x) from the mean line ML:

$$R\alpha = \frac{1}{n}\sum_{i}^{n} |Z_i(x)|$$

As noted hereinabove, the holes 120 of the article 100 have interior surfaces with a low surface roughness $R_a$ of less than 1 μm by using the hole fabrication processes described below.

Another morphological attribute is the shape of the surface of the article 100 proximate the opening defined by the hole 120. Depressions, mounds or other abnormalities near the holes may lead to plating, coating and bonding issues when subsequent processes are performed, such as redistribution layer application processes.

FIG. 8A schematically illustrates two holes 120 within an example article 100. Each hole 120 has a first opening 121 at a first surface 110 and a second opening 125 at a second surface 112. As shown in FIG. 8A, a first depressed region 123 surrounds the first opening 121, and a second depressed region 127 surrounds the second opening 125. These depressed regions are an effect of the etching process. Material removal surrounding the hole during the etching process may cause depressions or protrusions around the circumference of the hole. For example, laser-damaged glass may etch at a faster rate than non-laser-damaged glass, thereby creating depressed regions. Protrusions may form when etching a glass substrate without agitation. For example, when etching a glass-based substrate without agitation, glass-based material removed from the interior of the hole may accumulate at the entrance and/or exit of the hole.

Minimizing the depression depths $D_{dep}$ of these depressed regions improves the article 100 as an interposer device, for example. Pockets may form between the glass-based substrate and a subsequently deposited metal layer when depressions are present. Minimized depression depths $D_{dep}$ may reduce plating, coating and bonding issues when redistribution layers of the interposer device are applied to one or both surfaces of the article 100.

In embodiments, the depression depth $D_{dep}$ of the depressed regions surrounding the openings is less than or equal to a desired depth, such as a desired depth that is less than or equal to about 0.2 μm, less than or equal to about 0.15 μm, less than or equal to about 0.1 μm, or less than or equal to about 0.05 μm, in a range from about 0.01 μm to about 0.2 μm, in a range from about 0.01 μm to about 0.15 μm, in a range from about 0.05 μm to about 0.2 μm, in a range from about 0.05 μm to about 0.15 μm, in a range from about 0.1 μm to about 0.2 μm, or in a range from about 0.1 μm to about 0.15 μm.

FIG. 8A illustrates a method of determining the depression depth $D_{dep}$ of the depressed regions. A first plane 126 is defined by the first surface 110 of the article 100 based on an average thickness T of article 100. Similarly, a second plane 128 is defined by the second surface 112 of the article 100 based on the average thickness T of article 100. As described above with respect to FIG. 2B, the average thickness T of the article is determined by averaging three thickness measurements taken by an interferometer that are outside of any depressed region 123 (i.e., taken at a distance within a range of 500 μm and 2,000 μm).

The depression depth $D_{dep}$ of a hole 120 at the first surface 11—is measured from the first plane 126 to the first surface 110 at the opening of the hole 120, which is the location 131 of the start of the vertical wall 124 of the hole 120 (i.e., the transition from the depressed region 123 to the vertical wall 124 of the hole 120). The location 131 of the start of the vertical wall 124 is determined by measuring an angle α between a tangent line TL of the curved surface of the depressed region 123, 127 and the first plane 126 or the second plane 128. The location 131 of the start of the vertical wall 124, and therefore the location of the opening of the hole 120, is where the angle α is greater than 75 degrees. In other words, the depressed region 123, 127 is the region in which all angles α are less than 75 degrees. As a non-limiting example, the depths $D_{dep}$ of the first depression region 123 and the second depressed region 127 may be measured with an optical surface profilometer, such as the NewView 7300 available from Zygo Corporation.

It is noted that the larger the diameter of the hole, the larger the depression depth $D_{dep}$ proximate the opening of the hole. This may be because larger diameter holes require a longer etch time and thus more material is removed from the glass substrate during the etching process. As described in more detail below, in embodiments, the parameters of the hole fabrication process are such that the ratio of the depression depth $D_{dep}$ of the dressed regions within the radius R to the average hole diameter is less than or equal to 0.007, less than or equal to 0.006, less than or equal to 0.006, less than or equal to 0.005, less than or equal to 0.004, less than or equal to 0.003, less than or equal to 0.002, or less than or equal to 0.0015.

In some cases, an array of holes having small center-to-center spacing (i.e., pitch), the entire glass surfaces at the array of holes may be depressed as compared to the glass surfaces outside of the array of holes. This depressed region may occur when the spacing between holes is less than a radius of the depressed regions surrounding holes as a result of the etching process. As an example and not a limitation, a pitch p between holes of less than about 300 µm, less than about 200 µm, less than about 150 µm, less than about µm, or less than about 50 µm may cause the surfaces of the article to be depressed at the array of holes.

FIG. 8B depicts an example glass article 100' having an array 129 of holes 120 wherein the center-to-center spacing has caused the first surface 110 and the second surface 112 to become depressed at the array 129 of holes 120. Particularly, the first surface 110 and the second surface 112 at the array 129 of holes 120 is depressed from a first plane 126 and a second plane 128, respectively, by a depression depth $D_{dep}$. The first plane 126 and the second plane 128 may be determined by the average thickness T as described above. It should be understood that the depression depth $D_{dep}$ at the first surface 110 may be different from the depression depth $D_{dep}$ at the second surface 112. In embodiments described herein, the laser process parameters and etching process parameters are controlled such that the ratio of the depression depth $D_{dep}$ at either the first surface 110 or the second surface 112 to the average thickness T of the article is less than 0.007.

Figure 9:
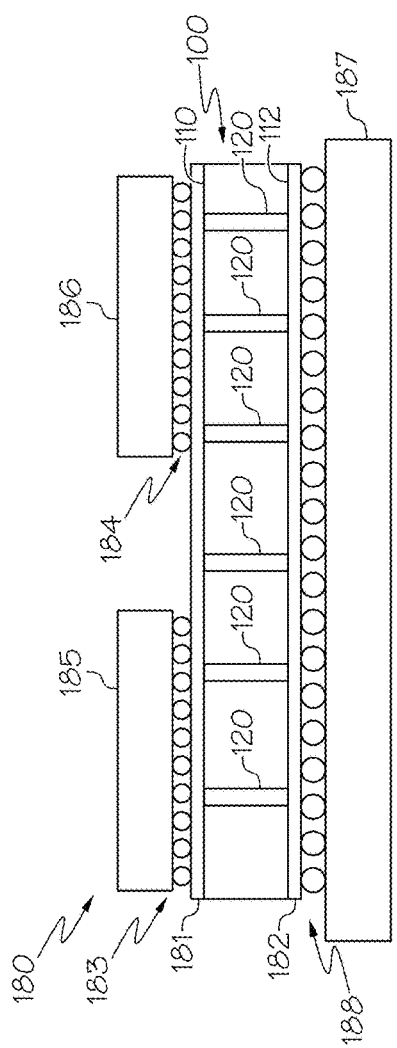
FIG. 9 schematically depicts an example semiconductor package incorporating an article as described herein as an interposer according to one or more embodiments described and illustrated herein.

Referring now to FIG. 9, an example semiconductor package 190 is schematically illustrated. The semiconductor package 190 includes an article 100 acting as an interposer between a first semiconductor device 185 and a second semiconductor device 186, and a substrate 187. A first metallization layer 181 (e.g., a first redistribution layer) is disposed on the first surface 110 of the interposer 100 and a second metallization layer 182 (e.g., a second redistribution layer) is disposed on the second surface 112 of the interposer 100. In the illustrated embodiment, the first semiconductor device 185 is electrically coupled to the first metallization layer 181 and the interposer 100 by a first ball grid array 183, and the second semiconductor device 186 is electrically coupled to the first metallization layer 181 and the interposer 100 by a second ball grid array 184. The second metallization layer 182 and the interposer 100 are electrically coupled to the substrate 187 by a third ball grid array 188. It should be understood that embodiments of the present disclosure are not limited by ball grid array interconnections, and any other interconnections may be utilized. The holes 120 are vias that are metalized with an electrically conductive material (e.g., copper) to pass electrical signals through the interposer 100.

The functionality of the semiconductor package is not limited by this disclosure. As one non-limiting example, the semiconductor package may be a high-frequency radio frequency ("RF") device utilized in wireless communication device (e.g., frequencies between about 100 kHz and about 100 GHz). The smooth interior walls of the etched through holes provide low high-frequency resistance, which is desirable in such high-frequency RF devices.

Embodiments of the present disclosure further include methods of fabricating holes 120 in the article 100 that have the morphology attributes described above. Generally, the holes 120 are fabricated by a laser damage and etch process, wherein a laser damage region or pilot hole is formed by application of a laser beam that is then further opened by a an etching solution to obtain a hole 120 having a desired diameter and morphology.

Figure 10:
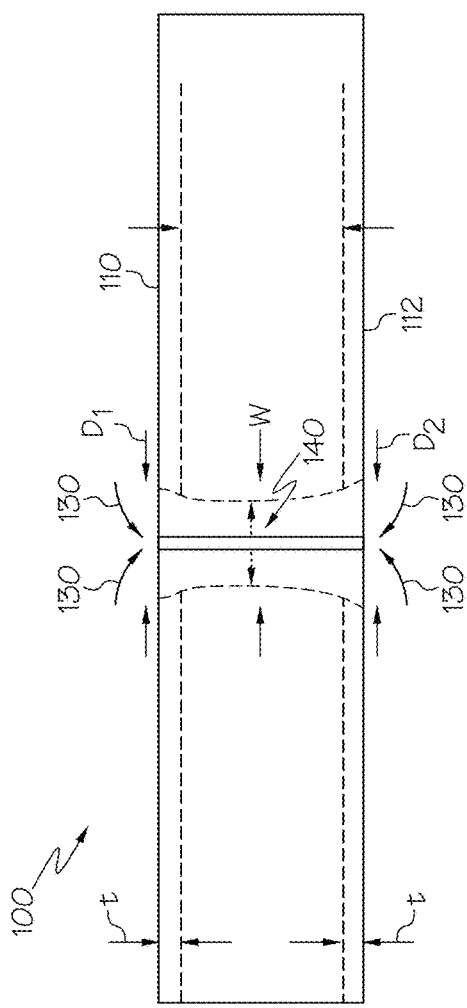
FIG. 10 schematically depicts an example etching process to open laser-drilled laser damage regions or pilot holes according to one or more embodiments described and illustrated herein.

Referring now to FIG. 10, an example article 100 undergoing a hole fabrication process is schematically illustrated. Generally, a laser damage region 140 or pilot hole is first formed through a bulk of the article 100. The laser damage region 140 creates a damages area within the article 100 that etches at a faster etch rate than non-damaged regions upon application of an etching solution 130. The etching solution 130 removes material (e.g., glass material) from the article 100 through the laser damage region 140 and the first surface 110 and the second surface 112. As schematically depicted by the dashed lines, material is removed by the etching solution 130 at a faster rate at the region proximate the laser damage region 140 than at the first surface 110 and the second surface 112. The etching solution 130 may be applied to the article 100 until a desired first diameter $D_1$ at the first surface 110 and/or a desired second diameter $D_2$ at the second surface 112 is achieved. Various laser and etching processes are described in detail below.

It is noted that not all laser processes can be used to generate high quality holes in glass material of the article 100. For example, micro cracks may be created by over-deposition of thermal energy into the glass, pieces of glass can be ejected from the laser entrance or exit holes in the glass, and ablative methods can often create very rough surfaces. All of these features create non-ideal shapes that subsequent chemical etching does not remove nor smooth out.

Figure 11:
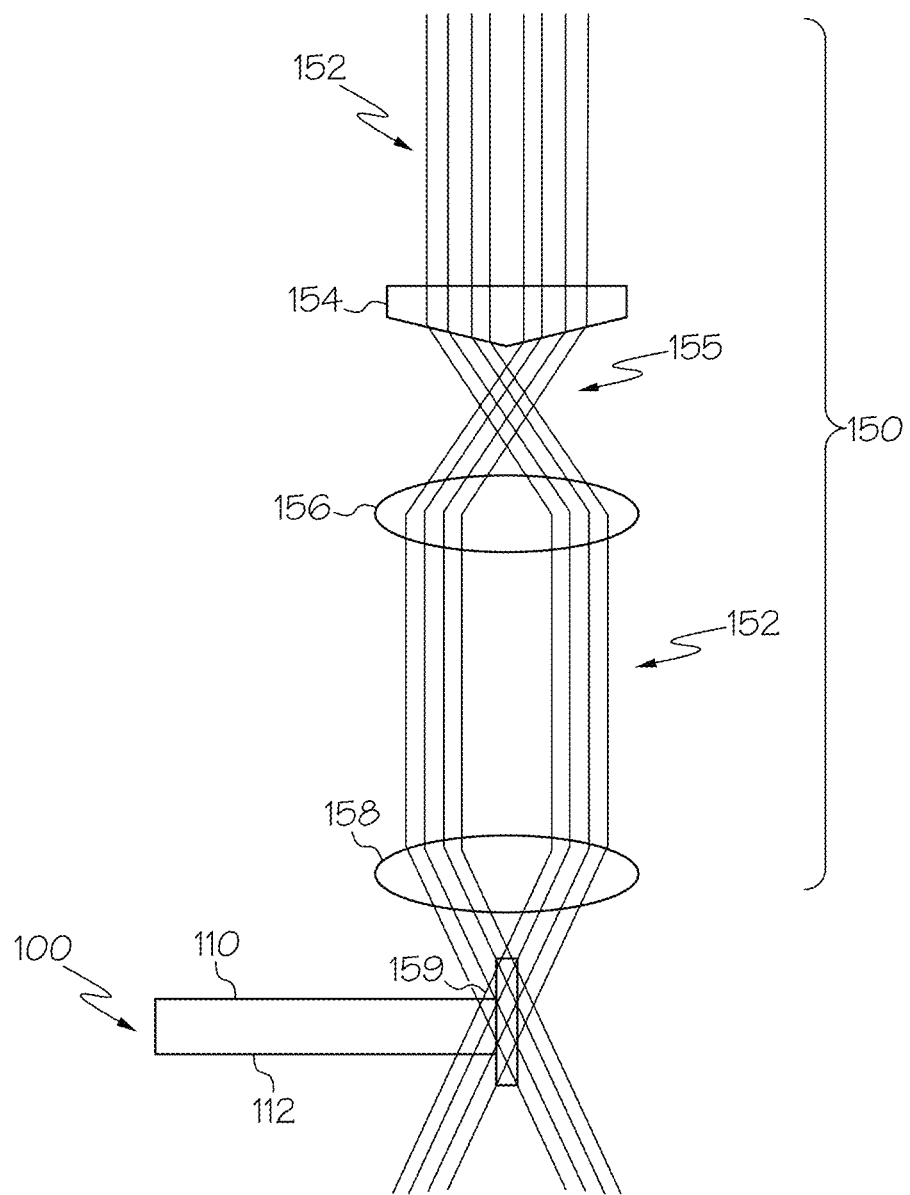
FIG. 11 schematically depicts an example laser system for creating laser damage regions or pilot holes in an article according to one or more embodiments described and illustrated herein.

A first distinct laser process that can be used to create the laser damage regions or pilot holes resulting in high-quality (e.g., smooth interior walls, minimum depression region depth, and the like as describe above) quickly and efficiently is illustrated in FIG. 11. This process uses a short pulse laser in combination with line focus optics to drill a pilot hole or laser damage region, completely through the body of the glass sheet with each laser pulse. The optics 150 used to generate such an extended focus are illustrated by FIG. 11. More detail regarding example line focus processes is provided in U.S. Pat. Publ. No. 2015/0166395, which is hereby incorporated by reference in its entirety.

The optics may include an axicon 154 that receives an incoming pulsed laser beam 152 and produces a line focus 155 along the optical axis of the axicon 154. The laser beam 152 is then received by a telescoping lens assembly including a first lens 156 that collimates the laser beam 152 received from the axicon 154, and a second lens 158 that focuses the laser beam into a line focus 159 disposed at least partially through the bulk of the article 100. In the example depicted by FIG. 11, the line focus 159 extends through the first surface 110 and the second surface 112 of the article.

An advantage of this process is that each laser pulse (or pulse burst as described in FIGS. 12A-12C) fully forms a pilot hole or laser damage region 140. Thus, the time to make a pilot hole or laser damage region 140 is extremely short (e.g., approximately, 10 psec with a single pulse, for example, or approximately hundreds of nanoseconds even with a complete burst pulse).

A further advantage of this line focus process is that it makes damage through the body of the glass that results in a hole 120 of nearly equal top and bottom diameter post-etch (i.e., $D_1$ and $D_2$). This contrasts with the significant taper that can be present in many other laser hole forming methods, where a constant angle may often be seen in the hole wall (e.g., 10 degrees), or the top and bottom of the via can be fundamentally different sizes, such as about a 10 µm difference in diameter.

In the line focus case, the interior roughness of the hole can be controlled by changing parameters of the hole formation process. In particular, these parameters can be divided into two categories: laser parameters and etching parameters. The laser parameters of the line process are described next, and the etching parameters are described in detail hereinbelow.

It has been observed that the quality of the hole strongly depends on the laser conditions employed. The material should be transparent to the wavelength of the pulsed laser beam. As an example and not a limitation, the wavelength may be within a range of 355 nm to 1100 nm. Common high energy pulsed laser wavelengths to use would include 1064 nm and its harmonics (532 nm, 355 nm), or 1030 nm and its harmonics (515 nm, 343 nm). In particular, it has been observed that a laser beam having a wavelength of about 532 nm produces high-quality holes 120 with lower interior surface roughness as compared to using a longer wavelength, such as 1064 nm.

The pulse duration and intensity should be short enough to achieve a multi-photon absorption effect. Ultra-short pulse lasers may be utilized, such as picosecond or femtosecond laser sources. In some embodiments, an approximately 10 picosecond pulsed laser may be utilized. The operation of such a picosecond laser described herein may create a "pulse burst" 160 comprising sub-pulses 160A. FIG. 12A depicts two successive pulse bursts 160, each comprising three sub-pulses 160A. Producing pulse bursts is a type of laser operation where the emission of pulses is not in a uniform and steady stream but rather in tight clusters of sub-pulses. Each pulse burst 160 contains multiple individual sub-pulses 160A (such as at least 2 sub-pulses, at least 3 sub-pulses, at least 4 sub-pulses, at least 5 sub-pulses, at least 10 sub-pulses, at least 15 sub-pulses, at least 20 sub-pulses, or more) of very short duration. That is, a pulse burst 160 is a "pocket" of sub-pulses 160A, and the pulse bursts 160 are separated from one another by a longer duration than the separation of individual adjacent pulses within each burst. Referring to FIG. 12B, which plots laser emission against time for single sub-pulse 160A of FIG. 12A, sub-pulses have may have a pulse duration $T_d$ of up to 100 psec (for example, 0.1 psec, 5 psec, 10 psec, 15 psec, 18 psec, 20 psec, 22 psec, 25 psec, 30 psec, 50 psec, 75 psec, or therebetween). These individual sub-pulses 160A within a single pulse burst 160A are referred to as sub-pulses herein to denote the fact that they occur within a single pulse burst. The energy or intensity of each individual sub-pulse 160A within the pulse burst 160 may not be equal to that of other sub-pulses within the pulse burst, and the intensity distribution of the multiple sub-pulses within a pulse burst often follows an exponential decay in time governed by the laser design.

Referring to FIG. 12C, preferably, each sub-pulse 160A within the pulse burst 160 of the example embodiments described herein are separated in time from the subsequent sub-pulse in the burst by a duration $T_p$ from 1 nsec to 50 nsec (e.g. 10-50 nsec, or 10-30 nsec, with the time often governed by the laser cavity design). For a given laser, the time separation $T_p$ between each sub-pulses 160A (sub-pulse-to-sub-pulse separation) within a pulse burst 160 is relatively uniform (±10%). For example, in some embodiments, each sub-pulse 160A within a pulse burst 160 may be separated in time from the subsequent sub-pulse by approximately 20 nsec (50 MHz). For example, for a laser that produces a sub-pulse separation $T_p$ of about 20 nsec, the sub-pulse-to-sub-pulse separation $T_p$ within a pulse burst is maintained within about ±10%, or is about ±2 nsec. The time between each pulse burst 160 of sub-pulses 160A (i.e., time separation $T_b$ between pulse bursts) will be much longer (e.g., 0.25 μsec≤$T_b$≤1000 μsec, for example 1-10 μsec, or 3-8 μsec). In some of the example embodiments of the laser described herein, the time separation $T_b$ is about 5 μsec for a laser with burst repetition rate or frequency of about 200 kHz.

The laser burst repetition rate (also referred to as burst repetition frequency herein) is defined as the time between the first sub-pulse 160A in a pulse burst 160 to the first sub-pulse 160A in the subsequent pulse burst 160. In some embodiments, the burst repetition frequency may be in a range of between about 1 kHz and about 4 MHz. More preferably, the laser burst repetition rates can be, for example, in a range of between about 10 kHz and 650 kHz. The time $T_b$ between the first sub-pulse in each pulse burst to the first pulse in the subsequent pulse burst may be 0.25 μsec (4 MHz burst repetition rate) to 1000 μsec (1 kHz burst repetition rate), for example 0.5 μsec (2 MHz burst repetition rate) to 40 μsec (25 kHz burst repetition rate), or 2 μsec (500 kHz burst repetition rate) to 20 μsec (50 kHz burst repetition rate). The exact timings, pulse durations, and burst repetition rates can vary depending on the laser design, but short sub-pulses ($T_d$<20 psec and preferably $T_d$≤15 psec) of high intensity have been shown to work particularly well. Generally, for a fixed per-pulse burst energy, increasing the number of pulses within changes the peak intensity experienced by the material, as well as the temporal distribution of energy. In general, larger sub-pulse numbers result in better hole quality and large process windows (e.g., greater than 10 sub-pulses per burst).

The amount of burst energy to modify the material will depend on the substrate material composition and the length of the line focus used to interact with the substrate. The longer the interaction region, the more the energy is spread out, and higher burst energy will be required. The exact timings, sub-pulse durations, and burst repetition rates can vary depending on the laser design, but short sub-pulses (<15 psec, or ≤10 psec) of high intensity have been shown to work well with this technique.

The energy per pulse burst 160 and the number of sub-pulses 160A per pulse burst impact the characteristics of the resulting hole 120. If the pulse burst energy is below a certain threshold (dependent on substrate composition and thickness), after etching the lateral cracks that are formed during the laser processing result in uncontrolled profiles. On the other hand, when the burst energy is too high, the walls show higher roughness values and the entrances and the exits have an elliptical shape.

Figure 13A:
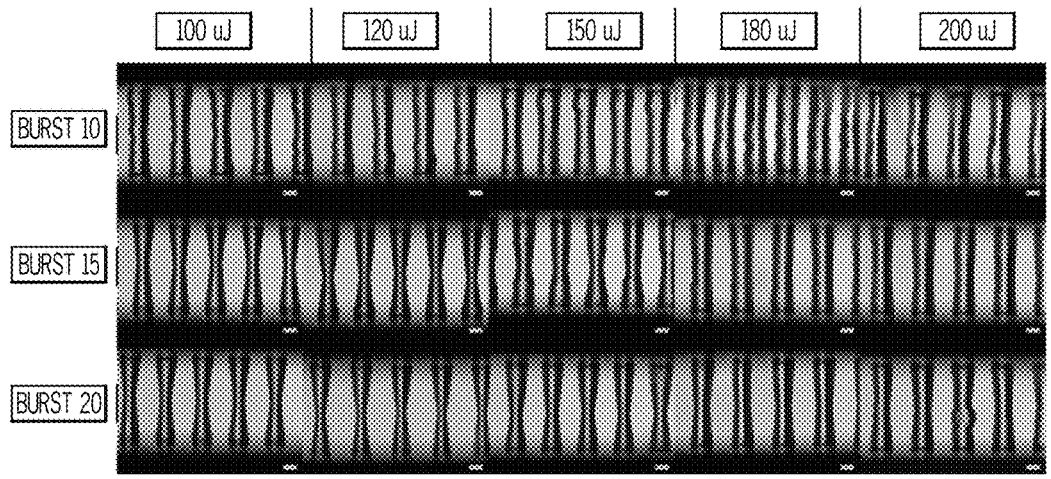
FIG. 13A are images illustrating hole morphology in glass for different pulse burst energies and numbers of sub-pulses per pulse burst using the example laser system depicted in FIG. 11.
Figure 13B:
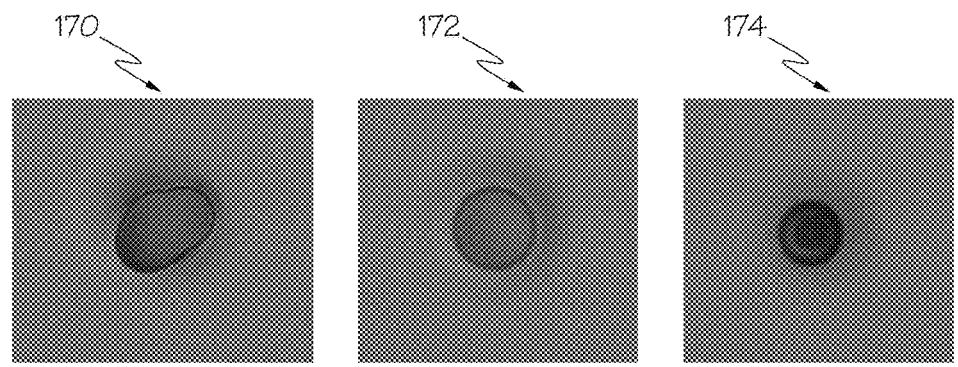
FIG. 13B are images showing a top view of holes on a glass-based substrate after laser exposure and etching at different laser pulse energies.
Figure 13C:
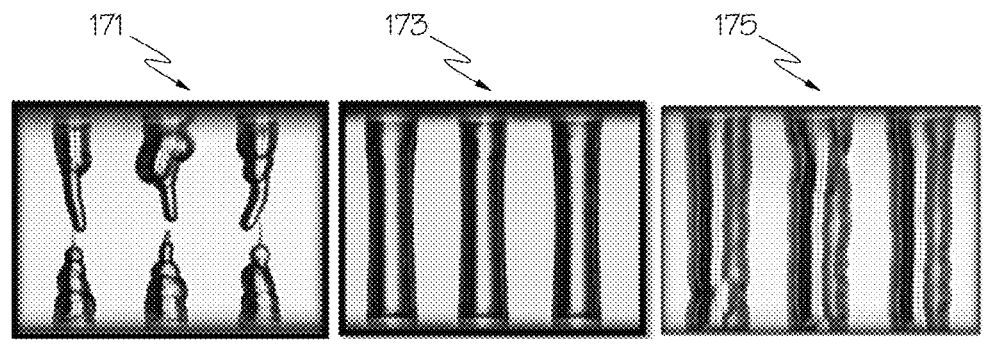
FIG. 13C are images showing a side view of holes on a glass-based substrate after laser exposure and etching at different pulse energies.

FIGS. 13A-C illustrate how, for a fixed laser wavelength (532 nm), the energy per pulse burst and the number of sub-pulses per pulse burst impact hole characteristics. FIG. 13A illustrates hole morphology in 400 μm thick Eagle XG® glass for different pulse burst energy and number of sub-pulses per pulse burst using a 532 nm following an etching process as described below. The etching process opens the pilot hole or laser damage region to a diameter of about 80 μm. For FIGS. 13A-13C, the etching process utilized an etching solution comprising 1.5M HF and 1.6M $HNO_3$ at room temperature and three-dimensional ultrasonic agitation at 80 kHz. The ultrasonic agitation was provided by a TRU-SWEEP™ model 4HI10146ST sold by Crest Ultrasonics of Trenton, N.J.

FIG. 13B is a top view of holes on a 400 μm thick Eagle XG® glass substrate after laser exposure and etching. As shown in FIG. 13B, when the energy pulse burst is too high the hole becomes elliptical due to lateral cracks creating preferential direction for the etchant (image 170). The glass substrate depicted in image 170 was drilled with a laser burst energy of burst energy of 180 μJ. When the energy of the pulse burst is too low, the hole is closed even after etching (image 174). Image 174 depicts a glass substrate after laser exposure having a burst energy of 180 µJ. Image 172 shows a hole having good circularity that is round both before and after etching. The burst energy that produced the hole shown in image 172 was 90 µJ. FIG. 13C depicts side profiles (cross sections) of holes in 400 µm thick EXG glass where the pulse burst energy is too high (image 171, 180 µJ burst energy), too low (image 175, 40 µJ burst energy) and ideal (image 173, 90 µJ burst energy).

Figure 14:
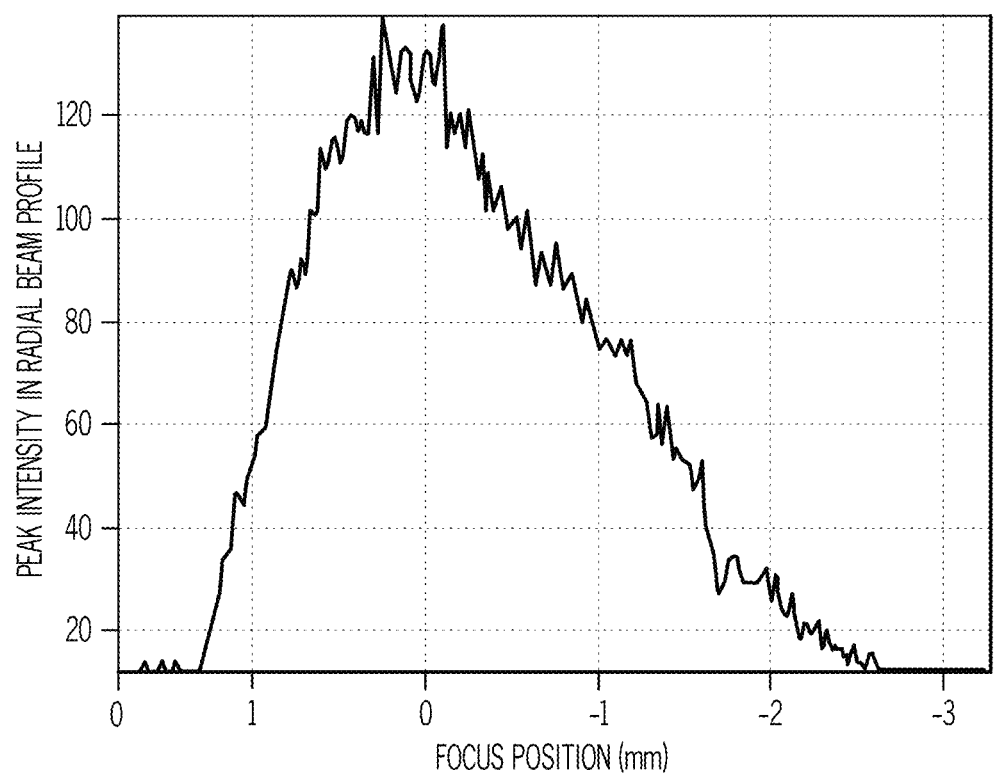
FIG. 14 graphically illustrates experimental measurement of peak on-axis intensity of a Gauss-Bessel beam vs. distance along the beam propagation (optical) axis.

Furthermore, a uniform distribution of the optical energy through the thickness of the material may generate smoother holes. If the optical energy is too large in one portion of the material, it can generate micro-cracks rather than just material modification. These micro cracks create preferential etch paths and result in bumps in the sidewall of the holes and in elliptical shaped holes. However, if the energy is too low in one portion of the material, then no preferential path is created, resulting either in the failure to form a hole after etching, or in not controlling the direction of the path of etchant, which can result in the large "bulge" in the sidewall of the hole. The solution is to extend the length of the focal line so that the power variation through the thickness of the glass is kept to a low level. In practice, it may be desirable to keep the energy density variability through the glass thickness to less than 10%. This can be achieved by increasing the diameter of the laser beam 152 entering the axicon 154 illustrated in FIG. 11, which flattens the energy distribution along the optical axis. FIG. 14 shows the experimental measurement of peak intensity of a Gauss-Bessel beam. This is the peak intensity in each radial beam profile as a function of the distance along the optical axis. The laser beam illustrated in FIG. 14 is formed using an axicon and a two-lens telescope as shown in FIG. 11 that creates a line focus of approximately 2 mm length.

Increasing the length of the focal line having a flat top distribution provides the advantage that the optical energy in the laser beam is constrained to only the region in or near the material, making the optical system more efficient and thus allowing the ability to use lower energy lasers.

Figure 15:
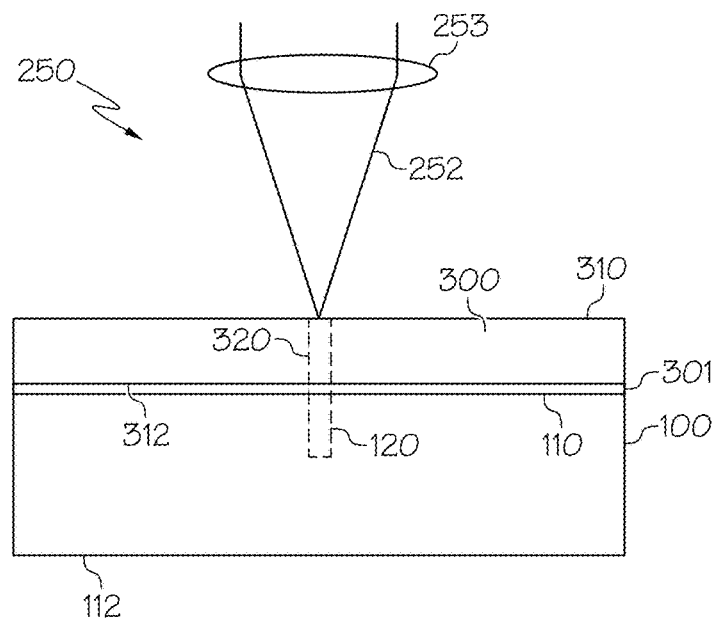
FIG. 15 schematically illustrates an example percussion laser-drilling system for forming laser damage regions or pilot holes through an article according to one or more embodiments described and illustrated herein.

A second example laser process is schematically illustrated by FIG. 15. The second laser process illustrated by FIG. 15 is a percussion laser-drilling process using an ultraviolet ("UV") (e.g., 355 nm) at about a 30 ns pulsed laser and one or more sacrificial cover layers. Example percussion laser drilling processes are described in U.S. Pub No. 2014/0147623 which are hereby incorporated by reference in their entirety.

FIG. 15 illustrates components used in an exemplary laser drilling method 250. The components of the laser drilling method 250 generally include an article 100, a sacrificial cover layer 300, and a laser beam 252. The article 100 may be a glass article, as described above. The sacrificial cover layer 300 may be made of any material such as, without limitation, glass, a polymer, ink, wax, and the like. In the embodiment shown in FIG. 15, the sacrificial cover layer 300 and the article 100 may be removably attached. The article 100 may be detachably attached to the sacrificial cover layer 300 through direct, physical contact, or by indirect attachment.

A gap 301 may be present between of a bottom surface 312 of the sacrificial cover layer 300 and the article 100. The gap 301 may be a thin gap, such as less than 200 µm, less than 100 µm, or less than 50 µm. The gap 301 may be an air gap formed when the article 100 and the sacrificial cover layer 300 are attached by direct, physical contact. Alternatively, the gap 301 may be filled with oil or other chemicals that provide attachment when the glass article 200 and the sacrificial cover layer 300 are attached via chemical attachment.

The desired location or pattern of holes to be formed in the article 100 may be determined before forming the holes 120 based on the desired use of the article 100. Referring to FIG. 15, a laser beam 252 may be positioned incident to a top surface 310 of the sacrificial cover layer 300 after being focused by a lens 253. The laser beam 252 may be positioned in a location on the top surface 310 of the sacrificial cover layer 300 that corresponds to a predetermined location of a hole in the article 100.

The laser beam 252 may be any laser beam having optical properties capable of drilling the sacrificial cover layer 300 and the article 100. In one embodiment, the laser beam 252 may be an ultra-violet (UV) laser beam that is a frequency tripled neodymium doped yttrium orthovanadate (Nd:YVO$_4$) laser, which emits a wavelength of about 355 nm. The laser beam 252 may interact with the material of sacrificial cover layer 300, vaporizing the material and, in the case of a glass sacrificial cover layer, creating a plasma that ejects material from the glass, thereby forming a hole. Although an Nd:YVO$_4$ laser is described above, it should be recognized that any laser that is capable of forming a through hole in the sacrificial cover layer 300 may be used. The laser beam 252 incident on the sacrificial cover layer 300 may have a numerical aperture between 0.01 and 0.5, such as between 0.02 and 0.4, between 0.05 and 0.3, between 0.06 and 0.2, and preferably 0.07. The focus of the laser beam 252 relative to the top surface 310 of the sacrificial cover layer 300 may be placed with about 200 µm of the top surface 310, such as within about 100 µm of the top surface 310, or within about 50 µm of the top surface 310.

Referring to FIG. 15, the laser beam 252 may be pulsed at the predetermined location to form a through hole 320 in the sacrificial cover layer 300. The pulse duration may be from about 20 nanoseconds to about 40 nanoseconds, or from about 25 nanoseconds to about 35 nanoseconds, or about 30 nanoseconds. The repetition rate of the pulse may be between 1 kHz and 150 kHz, such as between 1 kHz and 75, or between 1 kHz and 15 kHz. The energy per pulse may be 75-150 µJ, for example. The number of pulses required to form a through hole in the sacrificial cover layer 300 will vary depending on the material and the thickness of the sacrificial cover layer 300.

Generally, about 0.75 µm of hole depth is formed with each laser pulse through a sacrificial cover layer 300. Therefore, about 400 pulses may be required to make a through hole in 300 µm thick glass, about 675 pulses may be required to make a through hole in 400 µm thick glass, and about 950 pulses may be required to make a through hole in 700 µm thick glass. The laser beam may be pulsed any number of times required to form a through hole in the sacrificial cover layer 300.

The laser beam 252 may be pulsed into the through hole 320 in the sacrificial cover layer 300, thereby exposing the article 100 to the laser beam 252 at the predetermined location in which the through hole 320 in the sacrificial cover layer 300 was formed. The laser beam 252 may be pulsed into the through hole 320 any number of times to form a hole 120 in the article 100. Although FIG. 15 depicts a blind hole 120, it should be understood that the depth of the hole 120 in the article 100 depends on the number of pulses applied to the article 100 and is not limited by this disclosure. For example, the hole 120 in the article 100 may be a through hole, or may be a blind hole having any desired depth.

When using the above-described percussion laser drilling technique, the resulting laser-drilled hole tends to be very smooth, with a "fire polished" texture, and a surface roughness of the interior wall measured to be between about 0.2 μm $R_a$ and about 0.8 μm $R_a$. To obtain these low $R_a$ values, the numerical apertures of the laser beam should be controlled optimally to focus the laser beam at the surface of the material. The sacrificial cover layer suppresses damage at the laser entrance hole. Further, a pulse energy within a small range (e.g., pulse energy of 75-150 μJ) limits the formation of micro cracks generated by over-heating the material. If these process parameters are adhered to, then a hole with a smooth interior and highly circular top/bottom aperture (<5 μm circularity) may be fabricated. This low roughness is retained even after acid etching, as described in more detail below.

Etching processes to be used in conjunction with one of the laser processes described above to achieve desired hole morphology will now be described.

Figure 16:
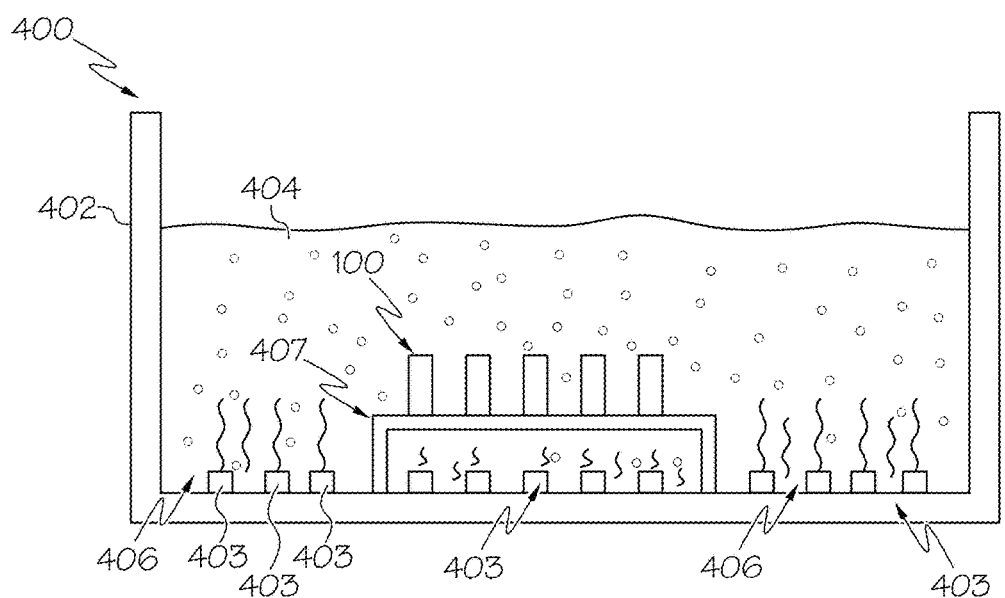
FIG. 16 schematically illustrates an example etching apparatus to open laser damage regions or pilot holes within an article according to one or more embodiments described and illustrated herein.

Referring now to FIG. 16, an example etching apparatus 400 to open the laser-drilled pilot holes or laser damage regions is schematically illustrated. The example etching apparatus 400 may generally include a container 402 maintaining an etching solution 404, a holder 407 holding one or more articles 100, and one or more ultrasonic transducers 403 controllable to produce ultrasonic agitation 406 within the etching solution 404. In some embodiments, the etching solution 404 may be maintained in an inner container that is positioned within water or another liquid that is maintained by an outer container, as described in U.S. application Ser. No. 15/177,431, which is hereby incorporated by reference in its entirety. The ultrasonic transducers 403 in such embodiments are disposed in the outer container and impart ultrasonic agitation to the water, which is then transmitted to the etching solution within the inner container.

Although the articles 100 are depicted as being maintained in a vertical position, embodiments are not limited thereto. For example, the articles 100 may be maintained in a horizontal position or any other position.

As noted hereinabove, another control for the interior wall surface roughness of the holes 120 within the article 100 is the etching conditions. When the laser beam damages the material, lateral cracks are created. If the etching rate is too low, the acid has enough time to diffuse into these lateral cracks, expanding them and creating bulges along the glass thickness. Conversely, if the etching rate is too high, the acid cannot diffuse into the laser damaged line or pilot hole and the hole will open in an hourglass shape (see FIG. 3B). The etching process should be fast enough such that the lateral cracks are etched before reaching too far from the hole center, but slow enough such that the etching along the glass thickness is homogeneous and a desirable hole aspect ratio is obtained.

For articles fabricated from alkaline boro-aluminosilicate glass, such as Eagle XG® sold by Corning Incorporated of Corning N.Y., etching rates within a range of about 1 μm/min. to 10 μm/min. provide holes having smooth interior walls ($R_a$<1 μm as measured in a process described above) when opening laser damage regions or pilot holes fabricated by one of the two laser processes described above. As another example, the etching rate may be in a range from 1 μm/min to 4 μm/min, or within a range from 3 μm/min. to 4 μm/min. As one non-limiting example of an etching solution and process yielding an etching rate of about 1 μm/min for Eagle XG® glass, an etching solution comprising 1.5M HF and 1.6M HNO3, with ultrasonic agitation within a frequency range of about 40 kHz and about 192 kHz and 20° C. etching solution temperature provides holes with smooth interior walls as described herein. As another non-limiting example, an etching solution comprising 3M HF, 2.4M HNO3 etched Eagle XG® glass at a rate of about 2 μm/min within a frequency range of about 40 kHz and about 192 kHz and 20° C. In some embodiments, the frequency of the ultrasonic agitation may be swept back and forth between a lowest frequency and a highest frequency.

Figure 17:
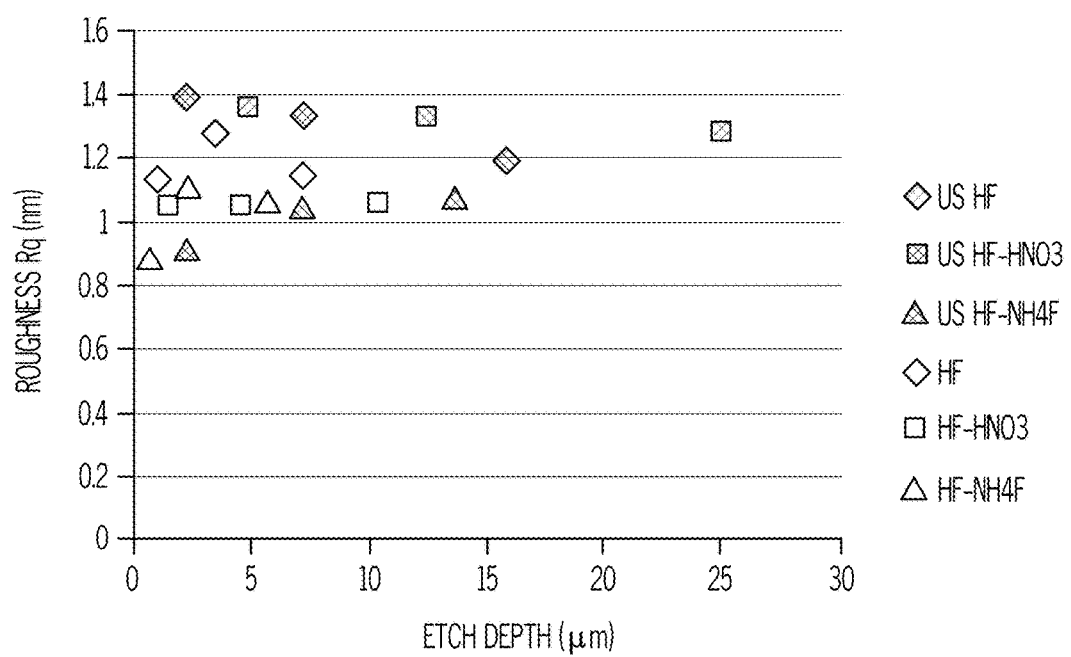
FIG. 17 graphically illustrates an effect of ultrasonic agitation during an etching process on surface roughness of a glass article.

Ultrasound agitation and the pH of the etching solution impact the surface roughness of the article, including the top surface and bottom surface. Referring to FIG. 17, three different etching solutions were employed to represent different pH levels. HF and $HNO_3$ provided a pH of less than or equal to zero (squares in FIG. 17) and HF provided a pH within a range of 1 to 2 (diamonds in FIG. 17). HF and $NH_4F$ provided a higher pH value within a range of 2 to 3 (triangles in FIG. 17). The darkened shapes represent cases when ultrasonic agitation was applied. The ultrasonic agitation was 40 kHz and provided by TRU-SWEEP™ model 4HI10146ST. Samples of 400 μm Eagle XG® were etched using the above-reference etching solutions both with and without ultrasonic agitation. As graphically illustrated in FIG. 17, the glass is rougher when it is etched in a low pH etching solution. Ultrasonic agitation makes the etched surface rougher when the glass is etched in low pH etchants (HF, HF—$HNO_3$), but not in the high pH etchant (HF—$NH_4F$).

In a non-limiting example, eight laser drilled holes were formed in a 300 μm thick Eagle XG® glass substrate using the line-focus drilling method described above. The sample holes were made with optics producing a focal line length of approximately 1.3 mm full width at half maximum, a wavelength of 532 nm, and a laser burst energy of 18 μJ, with 15 sub-pulses/burst. The glass substrate was then etched using an etching solution comprising 1.5M HF and 1.6M $HNO_3$ at room temperature and three-dimensional ultrasonic agitation at 80 kHz. The ultrasonic agitation was provided by a TRU-SWEEP™ model 4HI10146ST. Referring to Table 1 below, the average surface roughness of the interior walls of the sample holes after etching was less than 0.2 μm Ra using the calculation method described above.

TABLE 1

| Surface roughness (Ra) for holes formed in 300 μm Eagle XG ® glass | |
|---|---|
| Hole Number | Ra |
| 1 | 0.11 |
| 2 | 0.09 |
| 3 | 0.09 |
| 4 | 0.103 |
| 5 | 0.088 |
| 6 | 0.164 |
| 7 | 0.106 |
| 8 | 0.158 |
| Mean | 0.12 |
| Std. Deviation | 0.03 |

Parameters of the etching process may also be controlled to minimize the depression depth $D_{dep}$ surrounding the holes 120 as shown in FIG. 8A. As stated above, during the etching process, depressions can occur around the top and/or bottom openings of the holes 120, as well as the plateau regions in-between the holes where the surface roughness should be kept low to enable bonding of other materials to the surface of the part during downstream processing. It has been discovered that two approaches may be taken to suppress the depression depth $D_{dep}$ surrounding the holes 120: (1) reduce the etch rate during hole opening, and (2) increase the pH of the etching solution.

FIGS. 18A-18F show the effect of increasing the pH in opening 20 µm, 50 µm, and 90 µm diameter holes in 200 µm Eagle XG® glass sold by Corning Incorporated of Corning N.Y. Pilot hole patterns were created by a ultra-violet (UV) laser percussion drilling process. In this process, a 355 nm, approximately 30 nsec pulsed laser was focused using Gaussian optics to about a 6 µm $1/e^2$ diameter spot at the surface of the glass substrate. Individual laser pulses, at a repetition rate of 5 kHz, and pulse energy in the range of 60-90 µJ, were used to drill through "pilot" holes in the glass substrate before etching. In such a percussion drilling process, each laser pulse removes a small depth of glass, at a rate of approximately 1 µm per pulse, with the total depth of the hole controlled by the number of pulses used at particular hole locations. The result is a slightly tapered pilot hole of a diameter of about 5-15 µm, which subsequently are enlarged via a liquid etching process. While this particular laser process was used to create the etching results detailed in FIGS. 18A-18F, it should be understood that these results are applicable to the etching of pilot holes formed by other laser methods as well, such as the Bessel beam based drilling described above.

Figure 19:
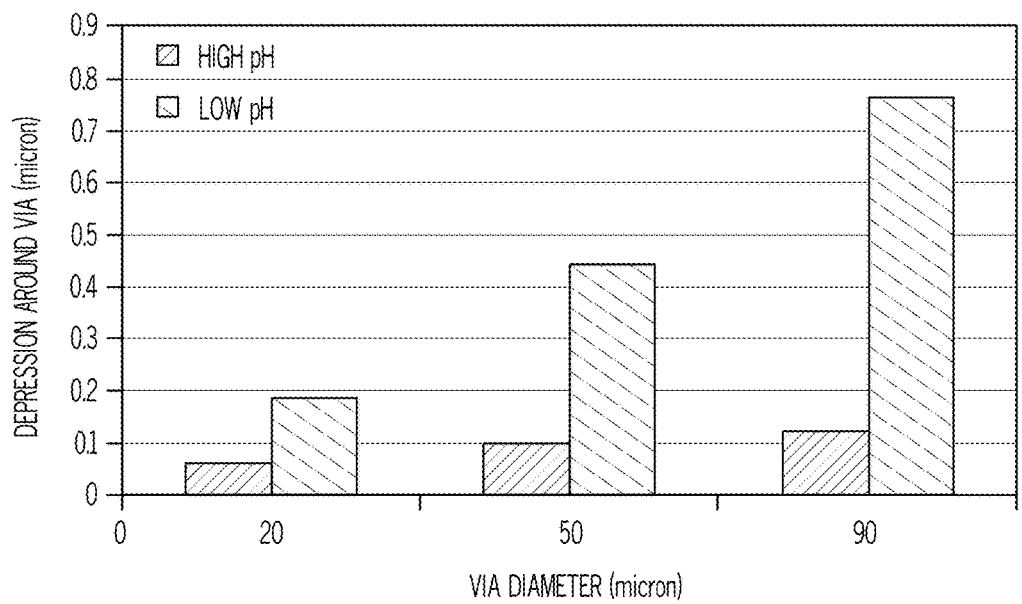
FIG. 19 graphically illustrates an effect of the pH of an etching solution on depression depth surrounding openings of the holes.

The high pH etching solution corresponding with FIGS. 18A-18C was formulated as 3M of HF and 1M of $NH_4F$ having a pH of about 1.6. The low pH etching solution corresponding with FIGS. 18D-18F was formulated as 3M of HF and 2.4M of $HNO_3$ having a pH of about 0.4. Ultrasonic energy of 40 kHz was applied during etching to agitate the glass and the etching solution. FIGS. 18A-18F are images captured by an optical interferometer sold by Zygo Corporation of Middlefield, Conn. The shading variation in FIGS. 18A-18F indicates the extent of surface waviness and depression around the holes. FIG. 19 graphically illustrates the resulting depression depth $D_{dep}$ for the glass articles having 20 µm, 50 µm, and 90 µm diameter holes using the two different etching solutions. FIGS. 18A-18F and 19 illustrate that the surface depression around the holes was significantly inhibited by etching the laser-drilled glass in an etching solution of higher pH.

Table 2 below provides additional non-limiting example etching solutions and respective observed etch rates with ultrasound agitation and estimated pH values.

TABLE 2

Example etching solutions and corresponding etch rates and pH

| Solution | Concentration | Ultrasound Etch Rate (µm/min) | Estimated pH |
|---|---|---|---|
| 1 | 1M HF | 0.22 | 1.60 |
| 2 | 3M HF | 0.73 | 1.36 |
| 3 | 6M HF | 1.58 | 1.21 |
| 4 | 1M HF-1.6M HNO3 | 0.49 | −0.20 |
| 5 | 3M HF-1.6M HNO3 | 1.24 | −0.20 |
| 6 | 6M HF-1.6M HNO3 | 2.50 | −0.20 |
| 7 | 1M HF-1M NH4F | 0.23 | 3.52 |
| 8 | 3M HF-1M NH4F | 0.72 | 2.90 |

TABLE 2-continued

Example etching solutions and corresponding etch rates and pH

| Solution | Concentration | Ultrasound Etch Rate (µm/min) | Estimated pH |
|---|---|---|---|
| 9 | 6M HF-1M NH4F | 1.37 | 2.55 |

Figure 20:
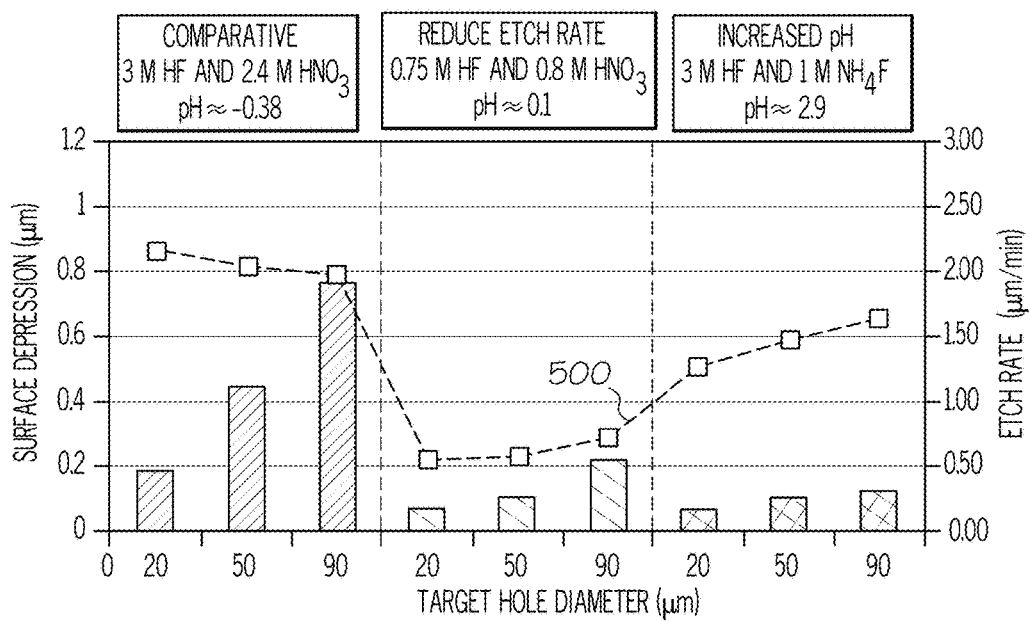
FIG. 20 graphically illustrates an effect of both reduction in etching rate and an increase in the pH of an etching solution on depression depth surrounding the opening of holes.

FIG. 20 graphically illustrates the effect of both reduction in etching rate (curve 500) and an increase in pH for a glass article comprising 400 µm thick Eagle XG® glass with holes having diameters of 20 µm, 50 µm, and 90 µm. As shown in FIG. 20, reduction in etching rate and increased pH reduces the depression depth $D_{dep}$ surrounding the openings of the holes.

As noted hereinabove, the laser and etching process parameters are such that a ratio of a depression depth $D_{dep}$ to an opening diameter D of the hole is less than or equal to 0.007, less than or equal to 0.0040, less than or equal to 0.005, less than or equal to 0.003, less than or equal to 0.002, or less than or equal to 0.0015. Table 3 illustrates the depression depth to opening diameter ($D_{dep}$/D) for the non-limiting examples depicted in FIG. 20.

TABLE 3

Example depression depth to opening diameter ratios ($D_{dep}$/D)

| Depression (µm) | Diameter (µm) | Ratio |
|---|---|---|
| Comparative | | |
| 0.18 | 20 | 0.0090 |
| 0.43 | 50 | 0.0086 |
| 0.75 | 90 | 0.0083 |
| Reduced etching rate | | |
| 0.06 | 20 | 0.0030 |
| 0.1 | 50 | 0.0020 |
| 0.2 | 90 | 0.0022 |
| Increased pH | | |
| 0.05 | 20 | 0.0025 |
| 0.10 | 50 | 0.0020 |
| 0.12 | 90 | 0.0013 |

As shown in Table 3 above, both reducing the etching rate provided by the etching solution and increasing the pH of the etching solution reduces the depression depth to opening diameter ratio ($D_{dep}$/D).

Referring briefly to FIG. 8A, the etching process rounds the hole 120 entrance 122. Whereas a side profile of a laser or mechanically drilled hole typically has a sharp angled transition (e.g., 90 degrees) between the top or bottom surface and the vertical wall of the hole, the removal of glass material during the etching process provides curved hole entrances 122 (i.e., the transition from the surface 110, 112 of the glass substrate 100 to the interior wall 124 of the hole).

During the etching process, physical properties of the glass substrate are altered. As a non-limiting example, for fusion-drawn glass substrates, the etching solutions described herein increase the surface roughness of the glass substrate (e.g., from about 0.2 nm—about 0.4 nm (Ra) pre-etch to about 0.6 nm (Ra) post-etch). The surface roughness of the glass substrate may be measured by any known or yet-to-be-developed measuring technique. Further, fluoride may be present at the surface of a glass substrate that has been etched, but not yet acid rinsed (e.g., rinsed by acids such as HCl, $H_2SO_4$, and the like). Fluoride may be detected by any suitable process such as, without limitation, time-of-flight secondary ion mass spectrometry. As such, the presence of fluoride may indicate that the glass substrate has been etched.

Further, acid etching may also produce a surface leaching layer on the surface of the glass substrate. When glass compositions that include modifiers such as alkaline metals and alkaline earth metals (e.g., K, Na, Ca, Mg, and the like) are etched, these modifiers are removed and replaced with protons ($H^+$) into a depth of the glass substrate. This region extending from the surface of the glass substrate into a depth is called the surface leaching layer. As an example and not a limitation, the surface leaching layer may be less than 100 nm in thickness, such as between 10 nm and 20 nm, between 10 nm and 30 nm, between 10 nm and 40 nm, between 10 nm and 50 nm, between 10 nm and 60 nm, between 10 nm and 70 nm, between 10 nm and 80 nm, between 10 nm and 90 nm and between 10 nm and 100 nm. This surface leaching layer will be present at every surface exposed to the etching solution, such as on the top surface, the bottom surface, and the sidewall of the holes of the glass substrate. This surface leaching layer, and therefore its lack of modifiers, is detectable by secondary ion mass spectrometry. It is noted that a surface leaching layer is not present in an etched glass substrate fabricated from fused silica.

Modifiers within the glass substrate (e.g., K, Na, Ca, and Mg) are also depleted at the location of the laser damage formed by the laser beam described above. For example, if a hole is created by a laser process, there will be less modifiers present proximate the laser drilled hole than at other regions of the glass substrate. During the etching process, however, modifiers are also removed from the surface of the glass substrate that has not been damaged by the laser.

It should be understood that embodiments described herein are directed to articles having holes with desired morphology attributes including, among others, interior walls having low roughness ($R_a$ less than 1 µm) and a depression depth $D_{dep}$ surrounding the openings of the holes that is less than 200 nm. Holes having low interior wall surface roughness allow for increased adhesion between the electrically conductive material and the interior wall. This provides very good electrical loss at high frequencies and high thermal stability. The small depression depth $D_{dep}$ around the openings of the holes increases the reliability of downstream processes (e.g., redistribution layer applications process) by minimizing plating, coating and bonding issues present when the surface is wavy.

Embodiments of the present disclosure are further directed to laser-drilling and etching processes that result in articles having holes with the desired morphology. Particularly, embodiments are directed to a laser line focus process capable of quickly forming laser damage regions or pilot holes through the article, and a percussion laser drilling process capable of producing laser drilled holes with minimal lateral microcracks. Etching solutions having an etch rate within a range of about 1 µm/min. and about 10 µm/min., and a high pH value between 1.0 and 2.0 open the laser-drilled holes fabricated by one of the two processes described above such that the holes have interior walls with low surface roughness and small depression depth $D_{dep}$ around hole openings Articles, such as glass articles, having the desired hole morphology described herein may be implemented as an interposer in a semiconductor device, such as an RF antenna, for example.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

The invention claimed is:

1. An article comprising:
   a glass-based substrate comprising a first surface, a second surface, and at least one hole extending from the first surface, wherein:
   the at least one hole comprises an interior wall having a surface roughness Ra that is less than or equal to 1 µm;
   the at least one hole comprises a first opening having a first diameter that is present at the first surface;
   a first plane is defined by the first surface of the glass-based substrate based on an average thickness of the glass-based substrate; and
   a ratio of a depression depth to the first diameter of the at least one hole is less than or equal to 0.007, wherein the depression depth is measured from the first plane to the first surface at the first opening of the at least one hole;
   the at least one hole is a through-hole such that a second opening of the at least one hole having a second diameter is present on the second surface;
   a difference between the first diameter and the second diameter is less than or equal to 2 µm;
   a circularity of the at least one hole is less than or equal to 5 µm;
   each of the first diameter and the second diameter is in a range from 5 µm to 250 µm; and
   an aspect ratio of the average thickness of the glass-based substrate to at least one of the first diameter and the second diameter is in a range from 1:1 to 15:1.

2. The article of claim 1, wherein:
   the at least one hole is a through hole extending from the first surface to the second surface such that a second opening having a second diameter is present on the second surface;
   a second plane is defined by the second surface of the glass-based substrate based on the average thickness of the glass-based substrate; and
   a ratio of a second depression depth to the second diameter of the at least one hole is less than or equal to 0.007, wherein the second depression depth is measured from the second plane to the second surface at the second opening of the at least one hole.

3. The article of claim 1, wherein the ratio of the depression depth to the first diameter of the at least one hole is less than or equal to 0.005.

4. The article of claim 1, wherein the surface roughness Ra of the interior wall is in a range from 0.1 µm to 1 µm.

5. The article of claim 1, wherein a circularity of the at least one hole is less than or equal to 5 µm.

6. The article of claim 1, wherein:
   the at least one hole comprises a waist having a waist diameter; and
   the waist diameter of the at least one hole is greater than or equal to 80% of a largest of the first diameter and the second diameter.

7. The article of claim 1, wherein:
   the at least one hole comprises a waist having a waist diameter; and
   the waist diameter is within a range from 20% to 100% of a largest of the first diameter and the second diameter.

8. An semiconductor package comprising:
the article of claim 1 having an electrically conductive material disposed within the at least one hole; and
a semiconductor device electrically coupled to the electrically conductive material disposed within the at least one hole.

9. An article comprising:
a glass-based substrate comprising a first surface, a second surface, and at least one hole extending from at least one of the first surface and the second surface, wherein:
the at least one hole comprises an interior wall having a surface roughness Ra that is in a range from 0.1 μm to 1 μm;
the at least one hole comprises a first opening having a first diameter at the first surface; and
the first diameter is in a range from 5 μm to 250 μm.

10. The article of claim 9, wherein the surface roughness Ra of the interior wall is in a range from 0.1 μm to 0.3 μm.

11. The article of claim 9, wherein the first diameter of the at least one hole is in a range from 5 μm to 100 μm.

12. A method of forming a hole in a substrate, the method comprising:
applying a pulsed laser beam to the substrate to form at least one laser damage region within the substrate; and
etching the substrate in a liquid etching solution to enlarge the at least one laser damage region to form at least one hole within the substrate, such that:
the at least one hole comprises an interior wall having a surface roughness Ra that is less than or equal to 1 μm;
the at least one hole comprises a first opening having a first diameter that is present on a first surface of the substrate; and
a ratio of a depression depth to the first diameter of the at least one hole is less than or equal to 0.007, wherein the depression depth is measured from a first plane to the first surface at the first opening of the at least one hole, and the first plane is defined by the first surface of the substrate based on an average thickness of the substrate.

13. The method of claim 12, wherein the liquid etching solution has a pH in a range from 1.0 to 2.0, and the liquid etching solution provides an etch rate that is less than about 4 μm/min.

14. The method of claim 12, wherein etching the substrate further comprises applying ultrasonic agitation to the liquid etching solution, the ultrasonic agitation having a frequency within a range from 40 kHz to 192 kHz.

15. The method of claim 12, wherein:
the liquid etching solution comprises 1.5M HF and 1.6M HNO3;
the temperature of the liquid etching solution is within a range of 10° C. to 30° C.; and
ultrasonic agitation is applied to the liquid etching solution, the ultrasonic agitation having a frequency within a range from 40 kHz to 192 kHz.

16. The method of claim 12, wherein applying the pulsed laser beam to the substrate further comprises:
affixing a sacrificial cover layer to a surface of the substrate;
positioning a laser beam in a predetermined location relative to the substrate and corresponding to a desired location of the at least one hole;
forming the at least one laser damage region in the sacrificial cover layer by repeatedly pulsing the laser beam at the predetermined location; and
pulsing the laser beam into a through-hole formed in the sacrificial cover layer at the predetermined location thereby creating the at least one damage region in the substrate.

17. The method of claim 16, wherein the laser beam has a numerical aperture between about 0.02 and about 0.4, and a focus position of the laser beam is within about 100 μm of a surface of the sacrificial cover layer.

18. The method of claim 17, wherein the laser beam has a wavelength of about 355 nm, the laser beam is has a pulse width between about 5 ns and about 75 ns, the laser beam is pulsed at a repetition rate between about 1 kHz and about 30 kHz, and the laser beam has a pulse energy between about 25 μJ and about 175 μJ.

19. The method of claim 12, wherein applying the pulsed laser beam to the substrate further comprises forming a damage track defining the at least one laser damage region into the substrate by focusing a pulsed laser beam into a laser beam focal line oriented along a beam propagation direction and directing the laser beam focal line into the substrate.

20. The method of claim 19, wherein the laser beam focal line extends through an entire bulk of the substrate.

21. The method of claim 19, wherein the pulsed laser beam comprises a sequence of bursts, each laser beam comprising a sequence of pulses.

22. The method of claim 21, wherein:
a number of pulses per burst is within a range of 10 to 20; and
an average energy per burst is within a range of 100 μJ to 200 μJ.

23. The method of claim 12, wherein the surface roughness Ra of the interior wall is in a range from 0.1 μm to 1 μm.

24. The method of claim 12, wherein the substrate is a glass-based substrate.

25. The method of claim 12, wherein:
the at least one hole is a through-hole such that a second opening having a second diameter is present on a second surface;
a second plane is defined by the second surface of the substrate based on the average thickness of the substrate; and
a ratio of a second depression depth to the second diameter of the at least one hole is less than or equal to 0.007, wherein the second depression depth is measured from the second plane to the second surface at the second opening of the at least one hole.

26. The method of claim 12, wherein:
the substrate is a glass-based substrate;
the at least one hole is a through-hole such that a second opening having a second diameter is present on a second surface of the glass-based substrate;
a difference between the first diameter and the second diameter is less than or equal to 2 μm;
a circularity of the at least one hole is less than or equal to 5 μm;
each of the first diameter and the second diameter is in a range from 5 μm to 250 μm; and
an aspect ratio of the average thickness of the substrate to at least one of the first diameter and the second diameter is in a range from 1:1 to 15:1.

27. The method of claim 26, wherein:
the at least one hole comprises a waist having a waist diameter; and the waist diameter of the at least one hole is greater than or equal to 80% of a largest of the first diameter of the first opening and the second diameter of the second opening.

28. The method of claim 26, wherein:

the at least one hole comprises a waist having a waist diameter; and the waist diameter is within a range from 20% to 100% of a largest of the first diameter of the first opening and the second diameter of the second opening.

29. An article comprising:

a glass-based substrate comprising a first surface, a second surface, and at least one hole extending from the first surface, wherein:

the at least one hole comprises an interior wall having a surface roughness Ra that is in a range from 0.1 µm to 1 µm;

the at least one hole comprises a first opening having a first diameter that is present at the first surface;

a first plane is defined by the first surface of the glass-based substrate based on an average thickness of the glass-based substrate; and a ratio of a depression depth to the first diameter of the at least one hole is less than or equal to 0.007, wherein the depression depth is measured from the first plane to the first surface at the first opening of the at least one hole.

\* \* \* \* \*

UNITED STATES PATENT AND TRADEMARK OFFICE
CERTIFICATE OF CORRECTION

PATENT NO. : 10,366,904 B2
APPLICATION NO. : 15/696736
DATED : July 30, 2019
INVENTOR(S) : Andres Covarrubias Jaramillo et al.

Page 1 of 1

It is certified that error appears in the above-identified patent and that said Letters Patent is hereby corrected as shown below:

In the Claims

In Column 30, Line 10 (approx.), Claim 18, after "laser beam" delete "is".

Signed and Sealed this
Twenty-fifth Day of February, 2020

Andrei Iancu
*Director of the United States Patent and Trademark Office*